(12) United States Patent
Roh et al.

(10) Patent No.: US 8,745,459 B2
(45) Date of Patent: *Jun. 3, 2014

(54) CHANNEL CODING METHOD OF VARIABLE LENGTH INFORMATION USING BLOCK CODE

(75) Inventors: Dong Wook Roh, Gyeonggi-do (KR); Joon Kui Ahn, Gyeonggi-do (KR); Nam Yul Yu, Gyeonggi-do (KR); Jung Hyun Cho, Gyeonggi-do (KR); Yu Jin Noh, Gyeonggi-do (KR); Ki Jun Kim, Gyeonggi-do (KR); Dae Won Lee, Gyeonggi-do (KR)

(73) Assignee: LG Electronics Inc., Seoul (KR)

( * ) Notice: Subject to any disclaimer, the term of this patent is extended or adjusted under 35 U.S.C. 154(b) by 680 days.

This patent is subject to a terminal disclaimer.

(21) Appl. No.: 12/343,666

(22) Filed: Dec. 24, 2008

(65) Prior Publication Data

US 2009/0168904 A1 Jul. 2, 2009

Related U.S. Application Data

(60) Provisional application No. 61/016,492, filed on Dec. 24, 2007, provisional application No. 61/021,337, filed on Jan. 16, 2008, provisional application No. 61/028,016, filed on Feb. 12, 2008.

(30) Foreign Application Priority Data

Jul. 30, 2008 (KR) .................. 10-2008-0074682

(51) Int. Cl.
*H03M 13/05* (2006.01)
*H03M 13/03* (2006.01)
*H03M 13/00* (2006.01)

(52) U.S. Cl.
USPC ............ 714/752; 714/759; 714/777; 714/779

(58) Field of Classification Search
USPC ......................................... 714/779
See application file for complete search history.

(56) References Cited

U.S. PATENT DOCUMENTS

| | | | |
|---|---|---|---|
| 6,813,506 B1 * | 11/2004 | Song | 455/466 |
| 2002/0013926 A1 * | 1/2002 | Kim et al. | 714/781 |

(Continued)

FOREIGN PATENT DOCUMENTS

| | | |
|---|---|---|
| CM | 101019348 | 8/2007 |
| CN | 1393071 | 1/2003 |

(Continued)

OTHER PUBLICATIONS

3GPP TS 25.212 V7.7.0 Technical Specification; Available Dec. 11, 2007; http://www.3gpp.org/ftp/Specs/html-info/25212.htm.*

(Continued)

*Primary Examiner* — Albert Decady
*Assistant Examiner* — Justin R Knapp
(74) *Attorney, Agent, or Firm* — Lee, Hong, Degerman, Kang & Waimey

(57) ABSTRACT

A channel coding method of variable length information using block code is disclosed. A method for channel-coding information bits using a code generation matrix including 32 rows and A columns corresponding to length of the information bits includes, channel-coding the information bits having "A" length using basis sequences having 32-bit length corresponding to columns of the code generation matrix, and outputting the channel-coded result as an output sequence. If "A" is higher than 10, the code generation matrix is generated when (A−10) additional basis sequences were added as column-directional sequences to a first or second matrix. The first matrix is a TFCI code generation matrix composed of 32 rows and 10 columns used for TFCI coding. The second matrix is made when at least one of an inter-row location or an inter-column location of the first matrix was changed. The additional basis sequences satisfy a value 10 of a minimum Hamming distance.

4 Claims, 2 Drawing Sheets

(56) References Cited

U.S. PATENT DOCUMENTS

| | | | |
|---|---|---|---|
| 2003/0174669 A1 | 9/2003 | Roh et al. | |
| 2004/0052236 A1* | 3/2004 | Hwang et al. | 370/342 |
| 2004/0140914 A1* | 7/2004 | Aldridge et al. | 341/50 |
| 2004/0216025 A1 | 10/2004 | Kim et al. | |
| 2005/0105502 A1* | 5/2005 | Kim et al. | 370/342 |
| 2006/0077947 A1 | 4/2006 | Kim et al. | |
| 2007/0177566 A1 | 8/2007 | Xu et al. | |
| 2008/0043867 A1 | 2/2008 | Blanz et al. | |
| 2008/0192705 A1* | 8/2008 | Suzuki | 370/335 |
| 2009/0168904 A1 | 7/2009 | Roh et al. | |
| 2009/0180461 A1* | 7/2009 | Song | 370/345 |

FOREIGN PATENT DOCUMENTS

| | | |
|---|---|---|
| CN | 1531236 | 9/2004 |
| CN | 1567730 | 1/2005 |
| CN | 1633761 | 6/2005 |
| GB | 2412553 | 9/2005 |
| JP | 2004-519161 | 6/2004 |
| JP | 2005-518136 | 6/2005 |
| JP | 3-847078 | 11/2006 |
| JP | 2011-501557 | 1/2011 |
| KR | 10-2001-0014778 | 2/2001 |
| KR | 1020010015268 | 2/2001 |
| KR | 1020020028860 | 4/2002 |
| KR | 1020030041728 | 5/2003 |
| KR | 10-0393618 | 8/2003 |
| KR | 1020030068749 | 8/2003 |
| KR | 1020060051349 | 5/2006 |
| KR | 10-0834662 | 6/2008 |
| KR | 10-0879942 | 1/2009 |
| WO | 0215409 | 2/2002 |
| WO | 2006/031070 | 3/2006 |
| WO | 2007-092816 | 8/2007 |

OTHER PUBLICATIONS

Y. Song, "Optimized Channel Coding of Control Channels for Mobile Packet Communication," Journal of the Korea Electromagnetic Engineering Society, vol. 3, No. 1, May 2003.

Samsung, "New Optimal Coding for Extended TFCI with Almost no Complexity Increase (rev 2)," TSG-RAN Working Group 1 meeting #7, TSGR1#7(99)99b60, XP-002254198, Aug. 30, 1999.

European Telecommunications Standards Institute (ESTI), "Universal Mobile Telecommunications System (UMTS); Multiplexing and Channel Coding (FDD) (3GPP TS 25.212 version 6.8.0 Release 6)," ETSI TS 125 212 V6.8.0, XP014034259, Jun. 2006.

LG Electronics, "Coding for CQI Moved from PUCCH to PUSCH," 3GPP TSG RAN WG1 #52, R1-081098, XP050109548, Feb. 11, 2008.

Wilson, S., "Linear Block Codes," Digital Modulation and Coding, XP-002275914, pp. 411-493, 1996.

LG Electronics and Philips, "Consideration on Basis Sequences for CQI Coding," 3GPP TSG RAN WG1 #25, TSGR1#25-02-0653, XP050096204, Apr. 9, 2002.

LG Electronics: "On the Design of CQI coding in PUCCH" 3GPP Draft; R1-080548_LG TFCI Based PUCCH, 3rd Generation Partnership Project (3GPP), Mobile Competence Centre; 650, Route Des Lucioles, F-06921 Sophia-Antipolis Cedex; France, Jan. 15, 2008, XP050109057.

Samsung: "Coding scheme for Quality Indicator (rev. 1)" 3GPP Draft; R1-01-1324-Samsung QI Coding, 3rd Generation Partnership Project (3GPP), Mobile Competence Centre; 650, Route Des Lucioles; F-06921 Sophia-Antipolis Cedex; France, Nov. 22, 2001, XP050095582.

In the USPTO U.S. Appl. No. 13/605,867, Non-Final Office Action dated Oct. 26, 2012, 9 pages.

LG Electronics, et al., "Way Forward on PUCCH CQI coding," 3GPP TSG RAN WG1 #51bis, R1-080575, Jan. 2008, 2 pages.

MCC Support, "Report of 3GPP TSG RAN WG1 #51 bis v1.0.0," 3GPP TSG RAN WG1 Meeting #52, R1-080631, Feb. 2008, 75 pages.

European Patent Office Application Serial Number 08022392.8, Search Report dated May 6, 2013, 10 pages.

Kwon, et al., "Analysis of TFCI Coding Performance of WCDMA Systems," IEEE Communications Letters, vol. 9, No. 11, Nov. 2005, pp. 979-981.

Motorola, "Details of A/N Subcode for Extended CP," 3GPP TSG RAN1 #52, R1-080740, Feb. 2008, 3 pages.

* cited by examiner

_US 8,745,459 B2_

CHANNEL CODING METHOD OF VARIABLE LENGTH INFORMATION USING BLOCK CODE

CROSS-REFERENCE TO RELATED APPLICATIONS

Pursuant to 35 U.S.C. §119 (e), this application claims the benefit of U.S. Provisional Application Nos. 61/021,337 and 61/028,016, filed on Jan. 16, 2008 and Feb. 12, 2008, respectively, the contents of which are all hereby incorporated by reference herein in their entirety, and U.S. Provisional Application No. 61/016,492 filed on Dec. 24, 2007. Pursuant to 35 U.S.C. 119 (a), this application also claims the benefit of earlier filing date and right of priority to Korean Patent Application No. 10-2008-0074682, filed on Jul. 30, 2008, the contents of which are all hereby incorporated by reference herein in their entirety.

BACKGROUND OF THE INVENTION

1. Field of the Invention

The present invention relates to a coding method for a mobile communication system, and more particularly to a method for effectively performing a channel-coding process on information with various lengths using a block code.

2. Discussion of the Related Art

For the convenience of description and better understanding of the present invention, some concepts requisite for the present invention from among several basic coding theories will hereinafter be described in detail.

Generally, a general binary error correction code is denoted by [n, k, d], where "n" is the number of bits of coded codewords, "k" is the number of information bits created prior to the coding process, and "d" is a minimum distance between codewords. In this case, only the binary code has been considered for the above-mentioned binary error correction code, such that a number of possible codeword points in code space is denoted by $2^n$, and a total number of coded codewords is denoted by $2^k$. Also, if the minimum distance is not substantially considered to be important, the aforementioned binary error correction code may also be denoted by [n, k]. If there is no mention of the above error correction code in this application, it should be noted that individual values of "n", "k", and "d" be set to the above-mentioned values.

In this case, the above-mentioned error correction code should not be confused with a matrix-type block code composed of X number of rows (i.e., X rows) and Y number of columns (i.e., Y columns).

In the meantime, the coding rate R is defined as a specific value acquired when the number of information bits is divided by the number of bits of each codeword. In other words, the coding rate R is denoted by "k/n", i.e., R=k/n.

Next, the Hamming distance will hereinafter be described in detail.

If two binary codes having the same number of bits include some bits having different bit values, the above-mentioned Hamming distance is indicative of the number of the above bits having the different bit values. Generally, if the Hamming distance "d" is denoted by d=2a+1, "a" number of errors can be corrected. For example, if one of two codewords is 101011 and the other one is 110010, the Hamming distance between the two codewords is 3.

In the meantime, the term "minimum distance" for use in the coding theory is indicative of a minimum value between two arbitrary codewords contained in a code. The minimum distance is considered to be one of criteria to evaluate the performance of a code. The longer the distance between the codewords generated by the coding process, the lower the probability of mis-detecting a corresponding codeword to be another codeword; as a result, the coding performance becomes better. Performance of a total code is estimated by a minimum distance between codewords having the worst performance. In conclusion, if a minimum distance of a specific code is maximized, this specific code may have a superior performance.

In the next-generation mobile communication system, control information carries system constituent information and transmission channel information, such that it is considered to be very important information to determine a system performance. Generally, this control information has a short length to use a relatively small amount of system resources. The above-mentioned control information is coded by the coding technique very resistant to a channel error, and is then transmitted. A variety of coding schemes for the above control information have been considered in the 3GPP mobile communication system, for example, a short-length block code based on a Reed-Muller (RM) code, a tail-biting convolution code, and a repetition code of a complex code.

In the meantime, the control information for use in the 3GPP LTE system acting as an improved format of the above-mentioned mobile communication system is coded by means of block codes, such that the block-coded control information is then transmitted. In more detail, if the length of a transmission (Tx) information bit is "A", the channel-coding process is performed by a block code composed of 20 rows and A columns (i.e., (20,A) block code) during the transmission of a specific channel (e.g., Physical Uplink Control Channel (PUCCH)), and the channel-coding result is then transmitted. In the 3GPP LTE system, uplink control information is transmitted over the PUCCH and a PUSCH (i.e., a physical uplink shared channel). The control information transmitted over the PUSCH is channel-coded by a block code composed of 32 rows and A columns (i.e., (32,A) block code), such that the channel-coded control information is then transmitted.

In the meantime, the (32,A) block code may have various formats. It is difficult for the user to search for an optimum format after checking individual coding performances of each length of information bits associated with all block codes.

SUMMARY OF THE INVENTION

Accordingly, the present invention is directed to a method of channel-coding various lengths of information using a block code that substantially obviates one or more problems due to limitations and disadvantages of the related art.

An object of the present invention is to provide an effective (32,A) block coding method of various lengths of information. In other words, under the condition that the length of an information bit is changed in various ways and the bit length of a coded codeword is also changed in various ways, the present invention provides the (32,A) block coding method for effectively supporting the combination of various bit lengths.

In the meantime, the number of coded bits may be equal to or less than 32, and the number of information bits may be changed in various ways. Therefore, according to the following embodiments of the present invention, the present invention provides a method for effectively using only some necessary parts of all the proposed block codes associated with the number of specific-length information bits or the number of specific-length coded bits. On the contrary, if the coded bits with a length longer than the above specific length are needed, the present invention allows the block code based on the above specific length to be repeated, such that coded bits with longer-length are obtained.

To achieve these objects and other advantages and in accordance with the purpose of the invention, as embodied and broadly described herein, a method for channel-coding information bits using a code generation matrix which includes 32 rows and A columns corresponding to a length of the information bits, the method comprising: channel-coding the information bits having the length of A using basis sequences having a 32-bit length corresponding to individual columns of the code generation matrix, and outputting the channel-coded result as an output sequence, in which if the A value is higher than "10", the code generation matrix is generated when (A−10) number of additional basis sequences from among generation matrix which includes 32 rows and A columns corresponding to a length of the information bits, the method comprising: channel-coding the information bits having the length of A using basis sequences having a 32-bit length corresponding to individual columns of the code generation matrix, and outputting the channel-coded result as an output sequence, in which if the A value is higher than "10", the code generation matrix is generated when (A−10) number of additional basis sequences from among several additional basis sequences were added as column-directional sequences to a first or second matrix, in which the second matrix is made when at least one of the order of rows of the first matrix and the order of columns of the first matrix was changed, the first matrix is represented by the following Table,

TABLE

| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ |
|---|---|---|---|---|---|---|---|---|---|---|
| 0 | 1 | 1 | 0 | 0 | 0 | 0 | 0 | 0 | 0 | 0 |
| 1 | 1 | 1 | 1 | 0 | 0 | 0 | 0 | 0 | 0 | 1 |
| 2 | 1 | 0 | 0 | 1 | 0 | 0 | 1 | 0 | 1 | 1 |
| 3 | 1 | 0 | 1 | 1 | 0 | 0 | 0 | 0 | 1 | 0 |
| 4 | 1 | 1 | 1 | 1 | 0 | 0 | 0 | 1 | 0 | 0 |
| 5 | 1 | 1 | 0 | 0 | 1 | 0 | 1 | 1 | 1 | 0 |
| 6 | 1 | 0 | 1 | 0 | 1 | 0 | 1 | 0 | 1 | 1 |
| 7 | 1 | 0 | 0 | 1 | 1 | 0 | 0 | 1 | 1 | 0 |
| 8 | 1 | 1 | 0 | 1 | 1 | 0 | 0 | 1 | 0 | 1 |
| 9 | 1 | 0 | 1 | 1 | 1 | 0 | 1 | 0 | 0 | 1 |
| 10 | 1 | 0 | 1 | 0 | 0 | 1 | 1 | 1 | 0 | 1 |
| 11 | 1 | 1 | 1 | 0 | 0 | 1 | 1 | 0 | 1 | 0 |
| 12 | 1 | 0 | 0 | 1 | 0 | 1 | 0 | 1 | 1 | 1 |
| 13 | 1 | 1 | 0 | 1 | 0 | 1 | 0 | 1 | 0 | 1 |
| 14 | 1 | 0 | 0 | 0 | 1 | 1 | 0 | 1 | 0 | 0 |
| 15 | 1 | 1 | 0 | 0 | 1 | 1 | 1 | 1 | 0 | 1 |
| 16 | 1 | 1 | 1 | 0 | 1 | 1 | 1 | 0 | 0 | 1 |
| 17 | 1 | 0 | 0 | 1 | 1 | 1 | 0 | 0 | 1 | 0 |
| 18 | 1 | 1 | 0 | 1 | 1 | 1 | 1 | 0 | 0 | 0 |
| 19 | 1 | 0 | 0 | 0 | 1 | 1 | 0 | 0 | 0 | 0 |
| 20 | 1 | 0 | 1 | 0 | 0 | 0 | 1 | 0 | 0 | 0 |
| 21 | 1 | 1 | 0 | 1 | 0 | 0 | 0 | 0 | 0 | 1 |
| 22 | 1 | 0 | 0 | 0 | 1 | 0 | 0 | 1 | 1 | 0 |
| 23 | 1 | 1 | 1 | 0 | 1 | 0 | 0 | 0 | 1 | 1 |
| 24 | 1 | 1 | 1 | 1 | 1 | 0 | 1 | 1 | 1 | 1 |
| 25 | 1 | 1 | 0 | 0 | 0 | 1 | 1 | 1 | 0 | 0 |
| 26 | 1 | 0 | 1 | 1 | 0 | 1 | 0 | 0 | 1 | 1 |
| 27 | 1 | 1 | 1 | 1 | 0 | 1 | 0 | 1 | 1 | 1 |
| 28 | 1 | 0 | 1 | 0 | 1 | 1 | 1 | 0 | 1 | 0 |
| 29 | 1 | 0 | 1 | 1 | 1 | 1 | 1 | 1 | 1 | 0 |
| 30 | 1 | 1 | 1 | 1 | 1 | 1 | 1 | 1 | 1 | 1 |
| 31 | 1 | 0 | 0 | 0 | 0 | 0 | 0 | 0 | 0 | 0, | several additional basis sequences were added as column-directional sequences to a first or second matrix, in which the first matrix corresponds to a Transport Format Combination Indicator (TFCI) code generation matrix information composed of 32 rows and 10 columns used for coding TFCI information, the second matrix is made when at least one of the order of rows of the first matrix and the order of columns of the first matrix was changed, and the additional basis sequences satisfy a predetermined condition in which a value of a minimum Hamming distance is 10.

Preferably, the additional basis sequence includes 10 number of "0" values.

Preferably, the second matrix is made when at least one of the order of rows of the first matrix and the order of columns of the first matrix was changed, and includes lower 12 rows to be deleted to generate a third matrix, such that the third matrix corresponds to another code generation matrix for Physical Uplink Control Channel (PUCCH) transmission.

In another aspect of the present invention, there is provided a method for channel-coding information bits using a code generation matrix which includes 32 rows and A columns corresponding to a length of the information bits, the method comprising: channel-coding the information bits having the length of A using basis sequences having a 32-bit length corresponding to individual columns of the code generation matrix, and outputting the channel-coded result as an output sequence, in which the code generation matrix corresponds to a tenth matrix having 32 rows and A columns, in which a and the several additional basis sequences are equal to

[1, 1, 1, 1, 1, 1, 1, 1, 1, 1, 1, 1, 1, 1, 0, 0, 1, 1, 0, 0, 0, 1, 0, 1, 0, 1, 0, 1, 1, 1, 0, 0],

[1, 1, 1, 1, 1, 1, 1, 1, 1, 1, 1, 1, 1, 1, 1, 0, 0, 0, 0, 1, 1, 1, 1, 0, 1, 0, 0, 0, 0, 1, 0],

[0, 0, 1, 1, 1, 1, 1, 1, 1, 1, 1, 1, 1, 1, 1, 1, 1, 0, 0, 1, 0, 1, 0, 1, 1, 0, 0, 0, 1, 1, 0], and

[0, 0, 1, 1, 1, 0, 0, 1, 1, 1, 1, 1, 1, 1, 1, 1, 1, 1, 1, 1, 0, 1, 1, 0, 0, 1, 0, 1, 0, 0, 1], respectively.

fourth matrix corresponds to a matrix composed of 20 rows and A columns in which A number of basis sequences were sequentially selected from a left side of a fifth matrix represented by the following table,

TABLE

| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ | $M_{i,12}$ | $M_{i,13}$ |
|---|---|---|---|---|---|---|---|---|---|---|---|---|---|---|
| 0 | 1 | 1 | 0 | 0 | 0 | 0 | 0 | 0 | 0 | 0 | 1 | 1 | 0 | 0 |
| 1 | 1 | 1 | 1 | 0 | 0 | 0 | 0 | 0 | 0 | 1 | 1 | 1 | 0 | 0 |
| 2 | 1 | 0 | 0 | 1 | 0 | 0 | 1 | 0 | 1 | 1 | 1 | 1 | 1 | 1 |
| 3 | 1 | 0 | 1 | 1 | 0 | 0 | 0 | 0 | 1 | 0 | 1 | 1 | 1 | 1 |
| 4 | 1 | 1 | 1 | 1 | 0 | 0 | 0 | 1 | 0 | 0 | 1 | 1 | 1 | 1 |
| 5 | 1 | 1 | 0 | 0 | 1 | 0 | 1 | 1 | 1 | 0 | 1 | 1 | 1 | 0 |
| 6 | 1 | 0 | 1 | 0 | 1 | 0 | 1 | 0 | 1 | 1 | 1 | 1 | 1 | 0 |
| 7 | 1 | 0 | 0 | 1 | 1 | 0 | 0 | 1 | 1 | 0 | 1 | 1 | 1 | 1 |
| 8 | 1 | 1 | 0 | 1 | 1 | 0 | 0 | 1 | 0 | 1 | 1 | 1 | 1 | 1 |
| 9 | 1 | 0 | 1 | 1 | 1 | 0 | 1 | 0 | 0 | 1 | 1 | 1 | 1 | 1 |
| 10 | 1 | 0 | 1 | 0 | 0 | 1 | 1 | 1 | 0 | 1 | 1 | 1 | 1 | 1 |
| 11 | 1 | 1 | 1 | 0 | 0 | 1 | 1 | 0 | 1 | 0 | 1 | 1 | 1 | 1 |
| 12 | 1 | 0 | 0 | 1 | 0 | 1 | 0 | 1 | 1 | 1 | 1 | 1 | 1 | 1 |
| 13 | 1 | 1 | 0 | 1 | 0 | 1 | 0 | 1 | 0 | 1 | 1 | 1 | 1 | 1 |
| 14 | 1 | 0 | 0 | 0 | 1 | 1 | 0 | 1 | 0 | 0 | 1 | 0 | 1 | 1 |
| 15 | 1 | 1 | 0 | 0 | 1 | 1 | 1 | 1 | 0 | 1 | 1 | 0 | 1 | 1 |
| 16 | 1 | 1 | 1 | 0 | 1 | 1 | 0 | 0 | 1 | 0 | 1 | 1 | 1 | 1 |
| 17 | 1 | 0 | 0 | 1 | 1 | 1 | 0 | 0 | 1 | 0 | 0 | 1 | 1 | 1 |
| 18 | 1 | 1 | 0 | 1 | 1 | 1 | 1 | 1 | 0 | 0 | 0 | 0 | 0 | 1 |
| 19 | 1 | 0 | 0 | 0 | 0 | 1 | 1 | 0 | 0 | 0 | 0 | 0 | 0 | 1, | and a sixth matrix is a matrix made when at least one of the order of rows of the first matrix and the order of columns of the fourth matrix was changed, and a seventh matrix is a matrix made when additional 12 bits were added to each of basis sequences of the fourth or the sixth matrix, in which the seventh matrix corresponds to a matrix composed of 32 rows and A columns in which A number of basis sequences were sequentially selected from a left side of a eighth matrix represented by the following table, and a ninth matrix generated when at least one the order of rows of the seventh matrix and the order of columns of the seventh matrix was changed, and the tenth matrix is a code generation matrix generated when basis sequences corresponding to the A number of the basis sequences from a left side of the seventh or the ninth matrix were selected.

Preferably, if the A value is equal to or less than "14", a predetermined number of column-directional sequences corresponding to the A length on the basis of a left side of column-directional sequences of a eleventh matrix sequentially correspond to the basis sequences of the code generation matrix, in which the eleventh matrix is represented by the following Table,

TABLE

| I | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ | $M_{i,12}$ | $M_{i,13}$ |
|---|---|---|---|---|---|---|---|---|---|---|---|---|---|---|
| 0 | 1 | 1 | 0 | 0 | 0 | 0 | 0 | 0 | 0 | 0 | 1 | 1 | 0 | 0 |
| 1 | 1 | 1 | 1 | 0 | 0 | 0 | 0 | 0 | 0 | 1 | 1 | 1 | 0 | 0 |
| 2 | 1 | 0 | 0 | 1 | 0 | 0 | 1 | 0 | 1 | 1 | 1 | 1 | 1 | 1 |
| 3 | 1 | 0 | 1 | 1 | 0 | 0 | 0 | 0 | 1 | 0 | 1 | 1 | 1 | 1 |
| 4 | 1 | 1 | 1 | 1 | 0 | 0 | 0 | 1 | 0 | 0 | 1 | 1 | 1 | 1 |
| 5 | 1 | 1 | 0 | 0 | 1 | 0 | 1 | 1 | 1 | 0 | 1 | 1 | 1 | 0 |
| 6 | 1 | 0 | 1 | 0 | 1 | 0 | 1 | 0 | 1 | 1 | 1 | 1 | 1 | 0 |
| 7 | 1 | 0 | 0 | 1 | 1 | 0 | 0 | 1 | 1 | 0 | 1 | 1 | 1 | 1 |
| 8 | 1 | 1 | 0 | 1 | 1 | 0 | 0 | 1 | 0 | 1 | 1 | 1 | 1 | 1 |
| 9 | 1 | 0 | 1 | 1 | 1 | 0 | 1 | 0 | 0 | 1 | 1 | 1 | 1 | 1 |
| 10 | 1 | 0 | 1 | 0 | 0 | 1 | 1 | 1 | 0 | 1 | 1 | 1 | 1 | 1 |
| 11 | 1 | 1 | 1 | 0 | 0 | 1 | 1 | 0 | 1 | 0 | 1 | 1 | 1 | 1 |
| 12 | 1 | 0 | 0 | 1 | 0 | 1 | 0 | 1 | 1 | 1 | 1 | 1 | 1 | 1 |
| 13 | 1 | 1 | 0 | 1 | 0 | 1 | 0 | 1 | 0 | 1 | 1 | 1 | 1 | 1 |
| 14 | 1 | 0 | 0 | 0 | 1 | 1 | 0 | 1 | 0 | 0 | 1 | 0 | 1 | 1 |
| 15 | 1 | 1 | 0 | 0 | 1 | 1 | 1 | 1 | 0 | 1 | 1 | 0 | 1 | 1 |
| 16 | 1 | 1 | 1 | 0 | 1 | 1 | 0 | 0 | 1 | 0 | 1 | 1 | 1 | 1 |
| 17 | 1 | 0 | 0 | 1 | 1 | 1 | 0 | 0 | 1 | 0 | 0 | 1 | 1 | 1 |
| 18 | 1 | 1 | 0 | 1 | 1 | 1 | 1 | 1 | 0 | 0 | 0 | 0 | 0 | 1 |
| 19 | 1 | 0 | 0 | 0 | 0 | 1 | 1 | 0 | 0 | 0 | 0 | 0 | 0 | 1 |
| 20 | 1 | 0 | 1 | 0 | 0 | 0 | 1 | 0 | 0 | 0 | 1 | 0 | 1 | 1 |
| 21 | 1 | 1 | 0 | 1 | 0 | 0 | 0 | 0 | 0 | 1 | 1 | 1 | 0 | 0 |
| 22 | 1 | 0 | 0 | 0 | 1 | 0 | 0 | 1 | 0 | 1 | 0 | 1 | 1 | 0 |
| 23 | 1 | 1 | 1 | 0 | 1 | 0 | 0 | 0 | 1 | 1 | 1 | 0 | 0 | 1 |
| 24 | 1 | 1 | 1 | 1 | 1 | 0 | 1 | 1 | 1 | 0 | 0 | 1 | 0 | 0 |
| 25 | 1 | 1 | 0 | 0 | 0 | 1 | 1 | 1 | 0 | 0 | 1 | 1 | 1 | 0 |
| 26 | 1 | 0 | 1 | 1 | 0 | 1 | 0 | 0 | 1 | 0 | 0 | 0 | 0 | 1 |
| 27 | 1 | 1 | 1 | 1 | 0 | 1 | 0 | 1 | 1 | 1 | 1 | 0 | 0 | 0 |
| 28 | 1 | 0 | 1 | 0 | 1 | 1 | 0 | 1 | 0 | 0 | 1 | 0 | 0 | 1 |
| 29 | 1 | 0 | 1 | 1 | 1 | 1 | 1 | 1 | 0 | 0 | 1 | 1 | 0 | 1 |
| 30 | 1 | 1 | 1 | 1 | 1 | 1 | 1 | 1 | 1 | 1 | 0 | 1 | 1 | 0 |
| 31 | 1 | 0 | 0 | 0 | 0 | 0 | 0 | 0 | 0 | 0 | 0 | 0 | 0 | 1, |

TABLE

| I | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ | $M_{i,12}$ | $M_{i,13}$ |
|---|---|---|---|---|---|---|---|---|---|---|---|---|---|---|
| 0  | 1 | 1 | 0 | 0 | 0 | 0 | 0 | 0 | 0 | 0 | 1 | 1 | 0 | 0 |
| 1  | 1 | 1 | 1 | 0 | 0 | 0 | 0 | 0 | 0 | 1 | 1 | 1 | 0 | 0 |
| 2  | 1 | 0 | 0 | 1 | 0 | 0 | 1 | 0 | 1 | 1 | 1 | 1 | 1 | 1 |
| 3  | 1 | 0 | 1 | 1 | 0 | 0 | 0 | 0 | 1 | 0 | 1 | 1 | 1 | 1 |
| 4  | 1 | 1 | 1 | 1 | 0 | 0 | 0 | 1 | 0 | 0 | 1 | 1 | 1 | 1 |
| 6  | 1 | 0 | 1 | 0 | 1 | 0 | 1 | 0 | 1 | 1 | 1 | 1 | 1 | 0 |
| 8  | 1 | 1 | 0 | 1 | 1 | 0 | 0 | 1 | 0 | 1 | 1 | 1 | 1 | 1 |
| 9  | 1 | 0 | 1 | 1 | 1 | 0 | 1 | 0 | 0 | 1 | 1 | 1 | 1 | 1 |
| 10 | 1 | 0 | 1 | 0 | 0 | 1 | 1 | 1 | 0 | 1 | 1 | 1 | 1 | 1 |
| 11 | 1 | 1 | 1 | 0 | 0 | 1 | 1 | 0 | 1 | 0 | 1 | 1 | 1 | 1 |
| 12 | 1 | 0 | 0 | 1 | 0 | 1 | 0 | 1 | 1 | 1 | 1 | 1 | 1 | 1 |
| 13 | 1 | 1 | 0 | 1 | 0 | 1 | 0 | 1 | 0 | 1 | 1 | 1 | 1 | 1 |
| 15 | 1 | 1 | 0 | 0 | 1 | 1 | 1 | 1 | 0 | 1 | 1 | 0 | 1 | 1 |
| 16 | 1 | 1 | 1 | 0 | 1 | 1 | 1 | 0 | 0 | 1 | 0 | 1 | 1 | 1 |
| 17 | 1 | 0 | 0 | 1 | 1 | 1 | 0 | 0 | 1 | 0 | 0 | 1 | 1 | 1 |
| 19 | 1 | 0 | 0 | 0 | 0 | 1 | 1 | 0 | 0 | 0 | 0 | 0 | 0 | 1 |
| 7  | 1 | 0 | 0 | 1 | 1 | 0 | 0 | 1 | 1 | 0 | 1 | 1 | 1 | 1 |
| 14 | 1 | 0 | 0 | 0 | 1 | 1 | 0 | 1 | 0 | 0 | 1 | 0 | 1 | 1 |
| 5  | 1 | 1 | 0 | 0 | 1 | 0 | 1 | 1 | 1 | 0 | 1 | 1 | 1 | 0 |
| 18 | 1 | 1 | 0 | 1 | 1 | 1 | 1 | 0 | 0 | 0 | 0 | 0 | 0 | 1 |
| 20 | 1 | 0 | 1 | 0 | 0 | 0 | 1 | 0 | 0 | 0 | 1 | 0 | 1 | 1 |
| 21 | 1 | 1 | 0 | 1 | 0 | 0 | 0 | 0 | 0 | 1 | 1 | 1 | 0 | 0 |
| 22 | 1 | 0 | 0 | 0 | 1 | 0 | 0 | 1 | 1 | 0 | 1 | 0 | 1 | 1 |
| 23 | 1 | 1 | 1 | 0 | 1 | 0 | 0 | 0 | 1 | 1 | 1 | 1 | 0 | 1 |
| 24 | 1 | 1 | 1 | 1 | 1 | 0 | 1 | 1 | 1 | 1 | 0 | 0 | 1 | 0 |
| 25 | 1 | 1 | 0 | 0 | 0 | 1 | 1 | 1 | 0 | 0 | 1 | 1 | 1 | 0 |
| 26 | 1 | 0 | 1 | 1 | 0 | 1 | 0 | 0 | 1 | 1 | 0 | 0 | 0 | 1 |
| 27 | 1 | 1 | 1 | 1 | 0 | 1 | 0 | 1 | 1 | 1 | 0 | 1 | 0 | 0 |
| 28 | 1 | 0 | 1 | 0 | 1 | 1 | 1 | 0 | 1 | 0 | 0 | 1 | 0 | 1 |
| 29 | 1 | 0 | 1 | 1 | 1 | 1 | 1 | 1 | 1 | 0 | 0 | 1 | 1 | 0 |
| 30 | 1 | 1 | 1 | 1 | 1 | 1 | 1 | 1 | 1 | 1 | 1 | 0 | 1 | 0 |
| 31 | 1 | 0 | 0 | 0 | 0 | 0 | 0 | 0 | 0 | 0 | 0 | 0 | 0 | 1 |

Preferably, if the A value is equal to or less than "11", a predetermined number of column-directional sequences corresponding to the A length on the basis of a left side of column-directional sequences of a twelfth matrix sequentially correspond to the basis sequences of the code generation matrix, in which the twelfth matrix is represented by the following Table,

TABLE

| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ |
|---|---|---|---|---|---|---|---|---|---|---|---|
| 0  | 1 | 1 | 0 | 0 | 0 | 0 | 0 | 0 | 0 | 0 | 1 |
| 1  | 1 | 1 | 1 | 0 | 0 | 0 | 0 | 0 | 0 | 1 | 1 |
| 2  | 1 | 0 | 0 | 1 | 0 | 0 | 1 | 0 | 1 | 1 | 1 |
| 3  | 1 | 0 | 1 | 1 | 0 | 0 | 0 | 0 | 1 | 0 | 1 |
| 4  | 1 | 1 | 1 | 1 | 0 | 0 | 0 | 1 | 0 | 0 | 1 |
| 6  | 1 | 0 | 1 | 0 | 1 | 0 | 1 | 0 | 1 | 1 | 1 |
| 8  | 1 | 1 | 0 | 1 | 1 | 0 | 0 | 1 | 0 | 1 | 1 |
| 9  | 1 | 0 | 1 | 1 | 1 | 0 | 1 | 0 | 0 | 1 | 1 |
| 10 | 1 | 0 | 1 | 0 | 0 | 1 | 1 | 1 | 0 | 1 | 1 |
| 11 | 1 | 1 | 1 | 0 | 0 | 1 | 1 | 0 | 1 | 0 | 1 |
| 12 | 1 | 0 | 0 | 1 | 0 | 1 | 0 | 1 | 1 | 1 | 1 |
| 13 | 1 | 1 | 0 | 1 | 0 | 1 | 0 | 1 | 0 | 1 | 1 |
| 15 | 1 | 1 | 0 | 0 | 1 | 1 | 1 | 1 | 0 | 1 | 1 |
| 16 | 1 | 1 | 1 | 0 | 1 | 1 | 1 | 0 | 0 | 1 | 0 |
| 17 | 1 | 0 | 0 | 1 | 1 | 1 | 0 | 0 | 1 | 0 | 0 |
| 19 | 1 | 0 | 0 | 0 | 0 | 1 | 1 | 0 | 0 | 0 | 0 |
| 7  | 1 | 0 | 0 | 1 | 1 | 0 | 0 | 1 | 1 | 0 | 1 |
| 14 | 1 | 0 | 0 | 0 | 1 | 1 | 0 | 1 | 0 | 0 | 1 |
| 5  | 1 | 1 | 0 | 0 | 1 | 0 | 1 | 1 | 1 | 0 | 1 |
| 18 | 1 | 1 | 0 | 1 | 1 | 1 | 1 | 0 | 0 | 0 | 0 |
| 20 | 1 | 0 | 1 | 0 | 0 | 0 | 1 | 0 | 0 | 0 | 1 |
| 21 | 1 | 1 | 0 | 1 | 0 | 0 | 0 | 0 | 0 | 1 | 1 |
| 22 | 1 | 0 | 0 | 0 | 1 | 0 | 0 | 1 | 1 | 0 | 1 |
| 23 | 1 | 1 | 1 | 0 | 1 | 0 | 0 | 0 | 1 | 1 | 1 |
| 24 | 1 | 1 | 1 | 1 | 1 | 0 | 1 | 1 | 1 | 1 | 0 |
| 25 | 1 | 1 | 0 | 0 | 0 | 1 | 1 | 1 | 0 | 0 | 1 |
| 26 | 1 | 0 | 1 | 1 | 0 | 1 | 0 | 0 | 1 | 1 | 0 |
| 27 | 1 | 1 | 1 | 1 | 0 | 1 | 0 | 1 | 1 | 1 | 0 |
| 28 | 1 | 0 | 1 | 0 | 1 | 1 | 1 | 0 | 1 | 0 | 0 |

TABLE-continued

| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ |
|---|---|---|---|---|---|---|---|---|---|---|---|
| 29 | 1 | 0 | 1 | 1 | 1 | 1 | 1 | 1 | 1 | 0 | 0 |
| 30 | 1 | 1 | 1 | 1 | 1 | 1 | 1 | 1 | 1 | 1 | 1 |
| 31 | 1 | 0 | 0 | 0 | 0 | 0 | 0 | 0 | 0 | 0 | 0 |

Preferably, the method further comprises: if the number of bits (i.e., a bit number) of the output sequence is at least 32 (i.e., at least 32 bits), repeating each basis sequence of the code generation matrix a predetermined number of times, and performing a channel coding process using a specific part having a predetermined length corresponding to the bit number of the output sequence from among the repeated basis sequence.

Preferably, if the bit number of the output sequence is higher than 32 (i.e., 32 bits), the output sequence is acquired when the channel-coded result is cyclically repeated.

Preferably, the information bit corresponds to at least one of Channel Quality Information (CQI) and a Precoding Matrix Index (PMI).

Preferably, the output sequence is transmitted over a Physical Uplink Shared Channel (PUSCH).

It is to be understood that both the foregoing general description and the following detailed description of the present invention are exemplary and explanatory and are intended to provide further explanation of the invention as claimed.

According to the above-mentioned embodiments of the present invention, the present invention reuses a code generation matrix used for TFCI (Transport Format Combination Indicator) information coding of a conventional 3GPP system and/or the (20,A) code generation matrix for PUCCH transmission, such that it can easily implement the (32,k) block coding. As a result, a minimum-distance between the generated codewords increases, resulting in an increased system performance.

BRIEF DESCRIPTION OF THE DRAWINGS

The accompanying drawings, which are included to provide a further understanding of the invention, illustrate embodiments of the invention and together with the description serve to explain the principle of the invention.

In the drawings.

DETAILED DESCRIPTION OF THE INVENTION

Figure 1:
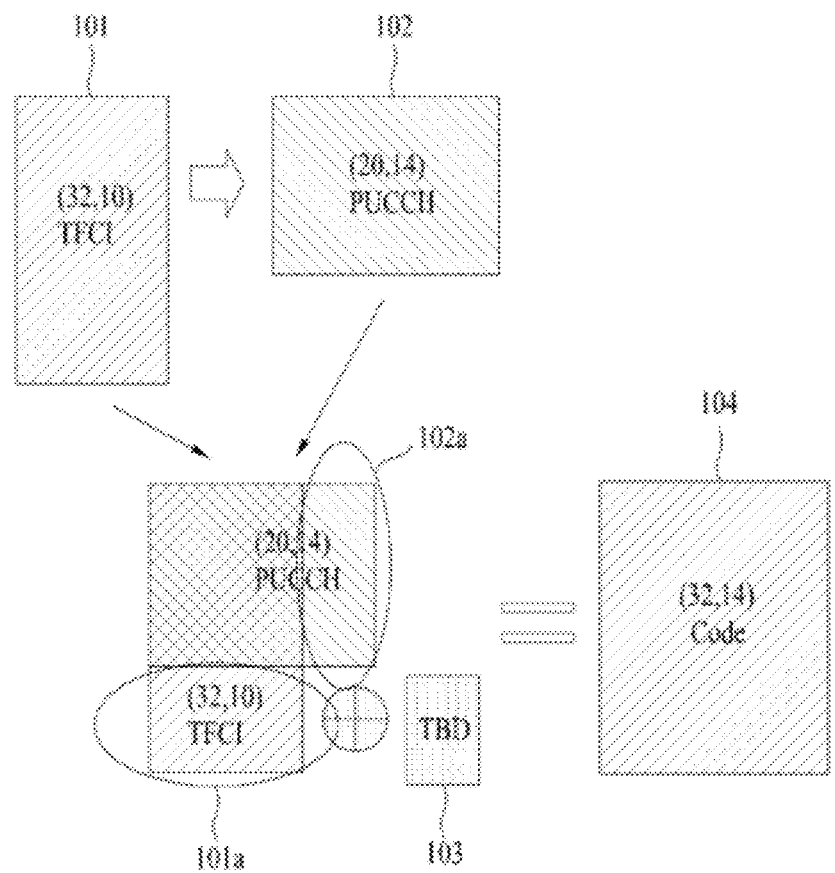
FIG. 1 is a conceptual diagram illustrating a method for generating the (32,14) block code using the (32,10) block code used for a conventional TFCI information coding and the (20,14) code used for PUCCH transmission according to the present invention.

Reference will now be made in detail to the preferred embodiments of the present invention, examples of which are illustrated in the accompanying drawings. Wherever possible, the same reference numbers will be used throughout the drawings to refer to the same or like parts.

Prior to describing the present invention, it should be noted that most terms disclosed in the present invention correspond to general terms well known in the art, but some terms have been selected by the applicant as necessary and will hereinafter be disclosed in the following description of the present invention. Therefore, it is preferable that the terms defined by the applicant be understood on the basis of their meanings in the present invention. For example, although the following description relates to a detailed example applied to the 3GPP LTE (3rd Generation Partnership Project Long Term Evolution) system, the present invention can also be applied to not only the above 3GPP LTE system but also other arbitrary communication systems which need to perform the channel coding process on various lengths of control information using the block code.

For the convenience of description and better understanding of the present invention, general structures and devices well known in the art will be omitted or be denoted by a block diagram or a flow chart. Wherever possible, the same reference numbers will be used throughout the drawings to refer to the same or like parts.

Firstly, items to be commonly considered by the present invention will hereinafter be described in detail.

The [n,k] code is a specific code in which the number of coded bits is "n" and the number of information bits is "k".

In this case, if there is no mention in a generation matrix of each code, this generation matrix is represented by a basic-sequence-type table. In fact, the coding method is similar to that of a TFCI code of the 3GPP release 99. In other words, the information bits are sequentially allocated to the left-sided basis sequence, and a sequence corresponding to the product of the basis sequence and the information bit is added by binary operations (i.e., Exclusive OR sum) corresponding to the number of information bits, such that coded bit are generated.

If the code is represented according to the above-mentioned method, although the number of information bits (hereinafter also referred to as "information bit number") is various, the present invention has an advantage in that it can perform the coding process of data on the basis of a matrix-type basis sequence table. The present invention is able to support a variety of information bit numbers using the above-mentioned advantages. Therefore, a basis sequence table or a code generation matrix is represented in consideration of a maximum-sized information bit number. If the maximum number of information bits needed for the actual application is less than the following proposed size, it is preferable to use a table obtained by deleting basis sequence(s) for bit(s) exceeding the maximum number of information bits from the basis sequence table.

In the meantime, the operation of replacing a generation code of "0" with another generation code of "1" according to the coding theory has no influence on the code characteristics. Therefore, although the value of "0" is replaced with the other value of "1" in the basis sequence table, the replaced result may indicate the same code feature. Also, although the order of coded bits is replaced with another order according to the coding theory, the replaced result may also indicate the same code feature. Therefore, although the row location is replaced with another row location in the basis sequence table, the replaced result may also indicate the same code feature.

The basis sequence proposed by the following embodiments is designed to have a various number of information bits (i.e., a various information-bit number), and is also designed to have a various number of coded bits (i.e., a various coded bit number). Therefore, in the case of devising the inventive concept of the present invention, a specific code in which a specific column is deleted from a specific basis sequence table was pre-considered. For example, if a basis sequence table is denoted by a specific format such as (32,14), the (20,11)-format basis sequence table is one of application examples of the above (32,14)-format basis sequence table. In more detail, if 12 columns are successively deleted from the bottom of the (32,14)-format basis sequence table, and 3 rows are deleted from the right of the (32,14)-format basis sequence table, the above-mentioned (20,11)-format basis sequence table can be acquired. In brief, the row and column of the basis sequence table according to the present invention have been decided on the basis of the largest size. In the case of the small-sized row and column, the rows and columns of the largest-sized basis sequence table are sequentially deleted from the right or the bottom of the above table, such that the deleted result is used. Needless to say, as previously stated above, although the row location may be replaced with the column location in the smaller-sized basis sequence table, or although the location of "0" is replaced with the other location of "1" in the basis sequence table, the above replaced results may have the same codes.

For the convenience of description and better understanding of the present invention, in the case of indicating the order of any data of the present invention, the information bits sequentially proceed in the direction from the left column to the right column in the above basis sequence table. The coded bits sequentially proceed in the direction from the uppermost row to the lowermost row in the above basis sequence table. The term "basis sequence table" may also be called "Code generation matrix" or other terms as necessary.

In the meantime, it is preferable that a specific-pattern basis sequence for use in a specific channel estimation method be unavailable. In this case, a specific table, from which a specific basis sequence based on a system type is removed, may be selected from various tables proposed by the following embodiments. From the viewpoint of the coding process, a corresponding basis sequence may always be considered to be "0", such that the same coding performance is made, but only the number of information bits is reduced.

Therefore, according to the basis sequence table proposed by the following embodiments, a specific basis sequence table having no specific basis sequence or a code generation matrix has already been considered in the case of designing the present invention.

According to the above-mentioned one aspect of the present invention, the present invention provides the (32,A)-format block coding method. In more detail, the present invention provides the (32,14)-format block coding method in consideration of the maximum length (i.e., 14 bits) of information bits. However, it should be noted that only some basis sequences from among the (32,14)-format code generation matrix be used according to the information-bit length as previously stated above.

Although a variety of methods can be used for the above-mentioned purposes, the following embodiments provide a code design method capable of maintaining a maximum common point with conventional codes using the conventional block codes. In more detail, the conventional codes provide a first method of using the (32,10)-format block code for the TFCI-information coding used in the 3GPP release 99 and a second method of using the (20,14)-format block code for PUCCH transmission. In this case, the above-mentioned (20, 14)-format block code has been disclosed in U.S. Provisional Application No. 61/016,492 used as priority of the present invention, entitled "GENERATION METHOD OF VARIOUS SHORT LENGTH BLOCK CODES WITH NESTED STRUCTURE BY PUNCTURING A BASE CODE" filed by the same applicant as the present invention, which is incorporated herein by reference. Detailed descriptions of the (32, 10)-format block code and the (20,14)-format block code will hereinafter be described in detail.

The (32,10)-format block code for the TFCI information coding and the (20,14)-format block code for PUCCH transmission will hereinafter be described in detail.

(32,10) TFCI Block Code and (20,14) Block Code

The (20,14) block code for use in this embodiment will be generated as follows. Firstly, (20,10) block code is generated from the (32,10)-structured TFCI code generation matrix, and 4 basis sequences are added to the (20,10) block code, such that the (20,14) block code is generated.

The (20,10) block code is based on the (32,10)-code generation matrix used for the channel coding of TFCI (Transport Format Combination Indicator) information in the 3GPP Rel' 99. As a result, the (20,10) block code can be designed to be punctured according to the length of a codeword to be coded.

The reuse of the (32,10) TFCI information code has a variety of advantages. For example, the TFCI information code has been designed on the basis of the Reed-Muller (RM) code, such that the punctured TFCI code may have a modified Reed-Muller (RM) code structure. This Reed-Muller (RM)-based code has an advantage in that it can be quickly decoded by a fast Hadamard transform method during the decoding process. For another example, the TFCI coding method supports a various-length information and coded bits with various lengths. In this way, the information-bit length or the coded-bit length can be changed in various ways, such that requirements for CQI transmission of the 3GPP LTE can be well satisfied.

The following Table 1 shows the (32,10)-code generation matrix used for the channel coding of TFCI information in the 3GPP Rel' 99. In this case, the (32,10)-code generation matrix generates a specific codeword which has the length of 32 bits and the value of $d_{min}=12$.

TABLE 1

| TFCI Index | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ |
|---|---|---|---|---|---|---|---|---|---|---|
| 0 | 1 | 0 | 0 | 0 | 0 | 1 | 0 | 0 | 0 | 0 |
| 1 | 0 | 1 | 0 | 0 | 0 | 1 | 1 | 0 | 0 | 0 |
| 2 | 1 | 1 | 0 | 0 | 0 | 1 | 0 | 0 | 0 | 1 |
| 3 | 0 | 0 | 1 | 0 | 0 | 1 | 1 | 0 | 1 | 1 |
| 4 | 1 | 0 | 1 | 0 | 0 | 1 | 0 | 0 | 0 | 1 |
| 5 | 0 | 1 | 1 | 0 | 0 | 1 | 0 | 0 | 1 | 0 |
| 6 | 1 | 1 | 1 | 0 | 0 | 1 | 0 | 1 | 0 | 0 |
| 7 | 0 | 0 | 0 | 1 | 0 | 1 | 0 | 1 | 1 | 0 |

TABLE 1-continued

| TFCI Index | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ |
|---|---|---|---|---|---|---|---|---|---|---|
| 8 | 1 | 0 | 0 | 1 | 0 | 1 | 1 | 1 | 1 | 0 |
| 9 | 0 | 1 | 0 | 1 | 0 | 1 | 1 | 0 | 1 | 1 |
| 10 | 1 | 1 | 0 | 1 | 0 | 1 | 0 | 0 | 1 | 1 |
| 11 | 0 | 0 | 1 | 1 | 0 | 1 | 0 | 1 | 1 | 0 |
| 12 | 1 | 0 | 1 | 1 | 0 | 1 | 0 | 1 | 0 | 1 |
| 13 | 0 | 1 | 1 | 1 | 0 | 1 | 1 | 0 | 0 | 1 |
| 14 | 1 | 1 | 1 | 1 | 0 | 1 | 1 | 1 | 1 | 1 |
| 15 | 1 | 0 | 0 | 0 | 1 | 1 | 1 | 1 | 0 | 0 |
| 16 | 0 | 1 | 0 | 0 | 1 | 1 | 1 | 1 | 0 | 1 |
| 17 | 1 | 1 | 0 | 0 | 1 | 1 | 1 | 0 | 1 | 0 |
| 18 | 0 | 0 | 1 | 0 | 1 | 1 | 0 | 1 | 1 | 1 |
| 19 | 1 | 0 | 1 | 0 | 1 | 1 | 0 | 1 | 0 | 1 |
| 20 | 0 | 1 | 1 | 0 | 1 | 1 | 0 | 0 | 1 | 1 |
| 21 | 1 | 1 | 1 | 0 | 1 | 1 | 0 | 1 | 1 | 1 |
| 22 | 0 | 0 | 0 | 1 | 1 | 1 | 0 | 1 | 0 | 0 |
| 23 | 1 | 0 | 0 | 1 | 1 | 1 | 1 | 1 | 0 | 1 |
| 24 | 0 | 1 | 0 | 1 | 1 | 1 | 1 | 0 | 1 | 0 |
| 25 | 1 | 1 | 0 | 1 | 1 | 1 | 1 | 0 | 0 | 1 |
| 26 | 0 | 0 | 1 | 1 | 1 | 1 | 0 | 0 | 1 | 0 |
| 27 | 1 | 0 | 1 | 1 | 1 | 1 | 1 | 1 | 0 | 0 |
| 28 | 0 | 1 | 1 | 1 | 1 | 1 | 1 | 1 | 1 | 0 |
| 29 | 1 | 1 | 1 | 1 | 1 | 1 | 1 | 1 | 1 | 1 |
| 30 | 0 | 0 | 0 | 0 | 0 | 1 | 0 | 0 | 0 | 0 |
| 31 | 0 | 0 | 0 | 0 | 1 | 1 | 1 | 0 | 0 | 0 |

Generally, as well known in the art, although the order of rows or the order of columns is changed in the block code, there is no difference in performance between the generated codewords. The following Table 2 shows a specific block code, which is equivalent to the (32,10) block code used for the aforementioned TFCI-information coding using the above-mentioned advantage.

TABLE 2

| | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| $g_{10by32}[1]$ | 1 | 0 | 1 | 0 | 1 | 0 | 1 | 0 | 1 | 0 | 1 | 0 | 1 | 0 | 1 | 0 |
| $g_{10by32}[2]$ | 1 | 1 | 0 | 0 | 1 | 1 | 0 | 0 | 1 | 1 | 0 | 0 | 1 | 1 | 0 | 0 |
| $g_{10by32}[3]$ | 1 | 1 | 1 | 1 | 0 | 0 | 0 | 0 | 1 | 1 | 1 | 1 | 0 | 0 | 0 | 0 |
| $g_{10by32}[4]$ | 1 | 1 | 1 | 1 | 1 | 1 | 1 | 1 | 0 | 0 | 0 | 0 | 0 | 0 | 0 | 0 |
| $g_{10by32}[5]$ | 1 | 1 | 1 | 1 | 1 | 1 | 1 | 1 | 1 | 1 | 1 | 1 | 1 | 1 | 1 | 1 |
| $g_{10by32}[6]$ | 1 | 1 | 1 | 1 | 1 | 1 | 1 | 1 | 1 | 1 | 1 | 1 | 1 | 1 | 1 | 1 |
| $g_{10by32}[7]$ | 1 | 1 | 1 | 0 | 1 | 1 | 1 | 0 | 0 | 0 | 0 | 0 | 1 | 1 | 1 | 1 |
| $g_{10by32}[8]$ | 1 | 1 | 1 | 0 | 0 | 0 | 1 | 1 | 1 | 0 | 1 | 1 | 0 | 1 | 1 | 0 |
| $g_{10by32}[9]$ | 1 | 1 | 0 | 1 | 0 | 1 | 0 | 0 | 1 | 1 | 0 | 1 | 1 | 0 | 0 | 0 |
| $g_{10by32}[10]$ | 1 | 0 | 0 | 0 | 1 | 0 | 1 | 0 | 1 | 1 | 1 | 1 | 0 | 1 | 0 | 0 |
| | 17 | 18 | 19 | 20 | 21 | 22 | 23 | 24 | 25 | 26 | 27 | 28 | 29 | 30 | 31 | 32 |
| $g_{10by32}[1]$ | 1 | 0 | 1 | 0 | 1 | 0 | 1 | 0 | 1 | 0 | 1 | 0 | 1 | 0 | 1 | 0 |
| $g_{10by32}[2]$ | 1 | 1 | 0 | 0 | 1 | 1 | 0 | 0 | 1 | 1 | 0 | 0 | 1 | 1 | 0 | 0 |
| $g_{10by32}[3]$ | 1 | 1 | 1 | 1 | 0 | 0 | 0 | 0 | 1 | 1 | 1 | 1 | 0 | 0 | 0 | 0 |
| $g_{10by32}[4]$ | 1 | 1 | 1 | 1 | 1 | 1 | 1 | 1 | 0 | 0 | 0 | 0 | 0 | 0 | 0 | 0 |
| $g_{10by32}[5]$ | 0 | 0 | 0 | 0 | 0 | 0 | 0 | 0 | 0 | 0 | 0 | 0 | 0 | 0 | 0 | 0 |
| $g_{10by32}[6]$ | 1 | 1 | 1 | 1 | 1 | 1 | 1 | 1 | 1 | 1 | 1 | 1 | 1 | 1 | 1 | 1 |
| $g_{10by32}[7]$ | 1 | 1 | 0 | 0 | 0 | 1 | 1 | 0 | 0 | 0 | 0 | 1 | 0 | 1 | 0 | 0 |
| $g_{10by32}[8]$ | 1 | 0 | 1 | 1 | 0 | 0 | 1 | 1 | 1 | 0 | 0 | 0 | 0 | 0 | 0 | 0 |
| $g_{10by32}[9]$ | 1 | 0 | 0 | 1 | 1 | 1 | 1 | 1 | 0 | 1 | 0 | 1 | 0 | 0 | 0 | 0 |
| $g_{10by32}[10]$ | 1 | 1 | 1 | 0 | 1 | 1 | 0 | 0 | 0 | 0 | 1 | 1 | 1 | 0 | 0 | 0 |

As can be seen from the block code shown in Table 2, the row- and column-locations of the (32,10) code used for the TFCI coding are changed to other locations, and locations of some columns (or locations of some rows on the basis of the TFCI information code) are exchanged with each other.

In other words, according to this embodiment of the present invention, 12 rows in either the (32,10)-format TFCI information code (Table 1) or its equivalent matrix (Table 2) may be punctured, or 20 rows are selected from (32,10)-format TFCI information code (Table 1) or its equivalent matrix (Table 2), such that the (20,10) block code is configured. In this case, from the viewpoint of the block code of Table 2, 12 columns may be punctured, and 20 columns may be selected. There is no difference in mode performance between the first case of using Table 1 and the second case of using Table 2. For the convenience of description and better understanding of the present invention, it is assumed that the present invention uses the equivalent format (See Table 2) of the TFCI information code if there is no mention in the above-mentioned description.

In the meantime, the (32,10) code used for coding the TFCI information has been generated on the basis of the Reed-Muller (RM) code. In this case, in order to implement an error correction performance, it is very important to search for a puncturing pattern which enables a codeword to have the longest distance ($d_{min}$).

Compared with this embodiment, an exhaustive search capable of searching for an optimum puncturing pattern in a generation matrix of the (32,10) code used for TFCI coding will hereinafter be described in detail. Provided that the number of columns of a generation matrix to be punctured in the (32×10) matrix (also denoted by (32*10) matrix) is set to "p", the number of all available puncturing patterns is denoted by $$\binom{32}{p}.$$

In this case, $$\binom{32}{p}$$

is indicative of the number of cases, each of which selects the p columns from among 32 columns.

For example, if the value of "p" is 12 (p=12), there are different (10×20) generation matrixes (i.e., $$\binom{32}{12} = 225{,}792{,}840$$

number of (10×20) generation matrixes), 10-bit information (i.e., $2^{10}=1{,}024$ number of information segments) is coded into a codeword of 20 bits. A minimum Hamming distance ($d_{min}$) between codewords generated by individual matrixes is calculated, such that a generation matrix having the highest value is found in the above minimum Hamming distance ($d_{min}$). If a puncturing pattern is used to make the generation matrix having the maximum ($d_{min}$) value, this puncturing pattern is considered to be the last pattern to be finally found. However, the generation of the optimum (20,10) block code on the basis of the above steps requires a large number of calculations, resulting in greater inconvenience of use.

Therefore, this embodiment of the present invention adds specific restriction conditions to the process for deciding the puncturing pattern, such that it reduces the range of a searching space for acquiring an optimum ($d_{min}$) value.

Next, a method for more effectively searching for a generation matrix of the (20,10) code which generates a codeword having $d_{min}=d$ will hereinafter be described in detail. Provided that a target ($d_{min}$) value is denoted by d, the Hamming weight $w(g_{10by20}[i])$ of each row vector $g_{10by20}[i]$ (1≤i≤10) of the (20,10)-code generation matrix has some requirements shown in the following Equation 1.

$$d \leq w(g_{10by20}[i]) \leq 20-d$$

i=0, 1, ..., 10 i≠6(There are all ones in this row vector)  [Equation 1]

For example, if the value of d is 6 (d=6), Equation 1 can be represented by the following Equation 2.

$$6 \leq w(g_{10by20}[i]) \leq 14 \quad\quad\quad [Equation\ 2]$$

Therefore, if the above restriction of Equation 2 is added to individual row vectors $g_{10by20}[i]$ of the (10*20) matrix generated from the above-mentioned exhaustive search process, the added result can reduce the number $$\left( N << \binom{32}{12} \right)$$

of searching spaces capable of searching for a generation matrix generating a codeword having $d_{min}=6$. Generally, based on various cited references, it is well known in the art that a maximum ($d_{min}$) value of the (20,10) code is 6, and its detailed description has been disclosed in "The Theory of Error-Correcting Codes (by F. J. MacWilliams and N. J. A. Sloane)". Therefore, the condition of $d_{min}=6$ is applied to the condition of Equation 1, such that 360 patterns indicating an optimum performance can be found.

The above 360 puncturing patterns have been disclosed in Appendix "A" of U.S. Provisional Application No. 61/016,492, entitled "GENERATION METHOD OF VARIOUS SHORT LENGTH BLOCK CODES WITH NESTED STRUCTURE BY PUNCTURING A BASE CODE" filed by the same applicant as the present invention. Specifically, indexes of punctured columns based on Table 2 have been disclosed in the Appendix "A". For the convenience of description, the above-mentioned indexes will herein be omitted.

The following pattern from among the above 360 puncturing patterns will hereinafter be described as an example.

The following Table 3 shows a specific pattern, which indicates the distribution of a specific Hamming weight from among the 360 patterns.

TABLE 3

| | 10 × 32 matrix | | | | | | | | | | | | | | | | |
|---|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | 16 | 17 |
| Table 2 | 0 | 0 | 1 | 1 | 1 | 0 | 1 | 1 | 0 | 0 | 1 | 1 | 1 | 1 | 0 | 1 | 0 |
| | 10 × 32 matrix | | | | | | | | | | | | | | | | |
| | 18 | 19 | 20 | 21 | 22 | 23 | 24 | 25 | 26 | 27 | 28 | 29 | 30 | 31 | 32 | | |
| Table 2 | 1 | 1 | 1 | 0 | 1 | 1 | 0 | 1 | 1 | 0 | 1 | 1 | 0 | 1 | 0 | | |

The puncturing patterns shown in Table 3 correspond to the sixth index of Table A.2 of the Appendix "A" of U.S. Provisional Application No. 61/016,492. In this case, the value "0" of Table 3 indicates that a column corresponding to the location of "0" is punctured. The value "1" of Table 3 indicates that a column corresponding to the location of "1" is not punctured but selected for the (20,10) block code.

In the case where the puncturing pattern of Table 3 is applied to Table 2, the result is shown as the following Table 4.

TABLE 4

| Index | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | puncturing for (20, 10) |
|---|---|---|---|---|---|---|---|---|---|---|---|
| 0 | 1 | 1 | 1 | 1 | 1 | 1 | 1 | 1 | 1 | 1 | Punctured |
| 1 | 0 | 1 | 1 | 1 | 1 | 1 | 1 | 1 | 1 | 0 | Punctured |
| 2 | 1 | 0 | 1 | 1 | 1 | 1 | 1 | 1 | 0 | 0 | |
| 3 | 0 | 0 | 1 | 1 | 1 | 1 | 0 | 0 | 1 | 0 | |
| 4 | 1 | 1 | 0 | 1 | 1 | 1 | 1 | 0 | 0 | 1 | |
| 5 | 0 | 1 | 0 | 1 | 1 | 1 | 1 | 0 | 1 | 0 | Punctured |
| 6 | 1 | 0 | 0 | 1 | 1 | 1 | 1 | 1 | 0 | 1 | |
| 7 | 0 | 0 | 0 | 1 | 1 | 1 | 0 | 1 | 0 | 0 | |
| 8 | 1 | 1 | 1 | 0 | 1 | 1 | 0 | 1 | 1 | 1 | Punctured |
| 9 | 0 | 1 | 1 | 0 | 1 | 1 | 0 | 0 | 1 | 1 | Punctured |
| 10 | 1 | 0 | 1 | 0 | 1 | 1 | 0 | 1 | 0 | 1 | |
| 11 | 0 | 0 | 1 | 0 | 1 | 1 | 0 | 1 | 1 | 1 | |
| 12 | 1 | 1 | 0 | 0 | 1 | 1 | 1 | 0 | 1 | 0 | |
| 13 | 0 | 1 | 0 | 0 | 1 | 1 | 1 | 1 | 0 | 1 | |
| 14 | 1 | 0 | 0 | 0 | 1 | 1 | 1 | 1 | 0 | 0 | Punctured |
| 15 | 0 | 0 | 0 | 0 | 1 | 1 | 1 | 0 | 0 | 0 | |
| 16 | 1 | 1 | 1 | 1 | 0 | 1 | 1 | 1 | 1 | 1 | Punctured |
| 17 | 0 | 1 | 1 | 1 | 0 | 1 | 1 | 0 | 0 | 1 | |
| 18 | 1 | 0 | 1 | 1 | 0 | 1 | 0 | 1 | 0 | 1 | |
| 19 | 0 | 0 | 1 | 1 | 0 | 1 | 0 | 1 | 1 | 0 | |
| 20 | 1 | 1 | 0 | 1 | 0 | 1 | 0 | 0 | 1 | 1 | Punctured |
| 21 | 0 | 1 | 0 | 1 | 0 | 1 | 1 | 0 | 1 | 1 | |
| 22 | 1 | 0 | 0 | 1 | 0 | 1 | 1 | 1 | 1 | 0 | |
| 23 | 0 | 0 | 0 | 1 | 0 | 1 | 0 | 1 | 1 | 0 | Punctured |
| 24 | 1 | 1 | 1 | 0 | 0 | 1 | 0 | 1 | 0 | 0 | |
| 25 | 0 | 1 | 1 | 0 | 0 | 1 | 0 | 0 | 1 | 0 | |
| 26 | 1 | 0 | 1 | 0 | 0 | 1 | 0 | 0 | 0 | 1 | Punctured |
| 27 | 0 | 0 | 1 | 0 | 0 | 1 | 1 | 0 | 1 | 1 | |
| 28 | 1 | 1 | 0 | 0 | 0 | 1 | 0 | 0 | 0 | 1 | |
| 29 | 0 | 1 | 0 | 0 | 0 | 1 | 1 | 0 | 0 | 0 | Punctured |
| 30 | 1 | 0 | 0 | 0 | 0 | 1 | 0 | 0 | 0 | 0 | |
| 31 | 0 | 0 | 0 | 0 | 0 | 1 | 0 | 0 | 0 | 0 | Punctured |

In this case, compared with Table 2, row- and column-directions of Table 4 are changed, but Table 4 has the same meaning as Table 2. 12 punctured rows from among individual row-directional sequences are shown at the right side of Table 4. As a result, the generated (20,10) block code can be represented by Table 4.

TABLE 5

| Index | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ |
|---|---|---|---|---|---|---|---|---|---|---|
| 2 | 1 | 0 | 1 | 1 | 1 | 1 | 1 | 1 | 0 | 0 |
| 3 | 0 | 0 | 1 | 1 | 1 | 1 | 0 | 0 | 1 | 0 |
| 4 | 1 | 1 | 0 | 1 | 1 | 1 | 1 | 0 | 0 | 1 |
| 6 | 1 | 0 | 0 | 1 | 1 | 1 | 1 | 1 | 0 | 1 |
| 7 | 0 | 0 | 0 | 1 | 1 | 1 | 0 | 1 | 0 | 0 |
| 10 | 1 | 0 | 1 | 0 | 1 | 1 | 0 | 1 | 0 | 1 |
| 11 | 0 | 0 | 1 | 0 | 1 | 1 | 0 | 1 | 1 | 1 |
| 12 | 1 | 1 | 0 | 0 | 1 | 1 | 1 | 0 | 1 | 0 |
| 13 | 0 | 1 | 0 | 0 | 1 | 1 | 1 | 1 | 0 | 1 |
| 15 | 0 | 0 | 0 | 0 | 1 | 1 | 1 | 0 | 0 | 0 |
| 17 | 0 | 1 | 1 | 1 | 0 | 1 | 1 | 0 | 0 | 1 |
| 18 | 1 | 0 | 1 | 1 | 0 | 1 | 0 | 1 | 0 | 1 |
| 19 | 0 | 0 | 1 | 1 | 0 | 1 | 0 | 1 | 1 | 0 |
| 21 | 0 | 1 | 0 | 1 | 0 | 1 | 1 | 0 | 1 | 1 |
| 22 | 1 | 0 | 0 | 1 | 0 | 1 | 1 | 1 | 1 | 0 |
| 24 | 1 | 1 | 1 | 0 | 0 | 1 | 0 | 1 | 0 | 0 |
| 25 | 0 | 1 | 1 | 0 | 0 | 1 | 0 | 0 | 1 | 0 |
| 27 | 0 | 0 | 1 | 0 | 0 | 1 | 1 | 0 | 1 | 1 |
| 28 | 1 | 1 | 0 | 0 | 0 | 1 | 0 | 0 | 0 | 1 |
| 30 | 1 | 0 | 0 | 0 | 0 | 1 | 0 | 0 | 0 | 0 |

In the meantime, there is a little difference between the order of rows of Table 4 or Table 5 and the matrix order of the 3GPP-based TFCI coding. As described above, although the location of each row is changed to another location according to the above-mentioned coding theory, there is no difference in performance between generated codewords. If the row order of Table 4 or Table is adjusted in the same manner as in the TFCI code matrix, the following Table 6 is acquired.

may be higher than 10 bits as necessary. However, a transmission (Tx) amount of actual CQI is decided according to a CQI generation method. For the coding process, the present invention may consider a method for supporting all the information bit numbers ranging from 4 bits to 14 bits.

Therefore, the (20,14) block coding method will hereinafter be described, which is capable of supporting a maximum of 14 bits by adding a column to the above (20,10) block code.

TABLE 6

| Table 4 Index | TFCI Index | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | Puncturing for (20, 10) |
|---|---|---|---|---|---|---|---|---|---|---|---|---|
| 30 | 0 | 1 | 0 | 0 | 0 | 0 | 1 | 0 | 0 | 0 | 0 | |
| 29 | 1 | 0 | 1 | 0 | 0 | 0 | 1 | 1 | 0 | 0 | 0 | Punctured |
| 28 | 2 | 1 | 1 | 0 | 0 | 0 | 1 | 0 | 0 | 0 | 1 | |
| 27 | 3 | 0 | 0 | 1 | 0 | 0 | 1 | 1 | 0 | 1 | 1 | |
| 26 | 4 | 1 | 0 | 1 | 0 | 0 | 1 | 0 | 0 | 0 | 1 | Punctured |
| 25 | 5 | 0 | 1 | 1 | 0 | 0 | 1 | 0 | 0 | 1 | 0 | |
| 24 | 6 | 1 | 1 | 1 | 0 | 0 | 1 | 0 | 1 | 0 | 0 | |
| 23 | 7 | 0 | 0 | 0 | 1 | 0 | 1 | 0 | 1 | 1 | 0 | Punctured |
| 22 | 8 | 1 | 0 | 0 | 1 | 0 | 1 | 1 | 1 | 1 | 0 | |
| 21 | 9 | 0 | 1 | 0 | 1 | 0 | 1 | 1 | 0 | 1 | 1 | |
| 20 | 10 | 1 | 1 | 0 | 1 | 0 | 1 | 0 | 0 | 1 | 1 | Punctured |
| 19 | 11 | 0 | 0 | 1 | 1 | 0 | 1 | 0 | 1 | 1 | 0 | |
| 18 | 12 | 1 | 0 | 1 | 1 | 0 | 1 | 0 | 1 | 0 | 1 | |
| 17 | 13 | 0 | 1 | 1 | 1 | 0 | 1 | 1 | 0 | 0 | 1 | |
| 16 | 14 | 1 | 1 | 1 | 1 | 0 | 1 | 1 | 1 | 1 | 1 | Punctured |
| 14 | 15 | 1 | 0 | 0 | 0 | 1 | 1 | 1 | 1 | 0 | 0 | Punctured |
| 13 | 16 | 0 | 1 | 0 | 0 | 1 | 1 | 1 | 1 | 0 | 1 | |
| 12 | 17 | 1 | 1 | 0 | 0 | 1 | 1 | 1 | 0 | 1 | 0 | |
| 11 | 18 | 0 | 0 | 1 | 0 | 1 | 1 | 1 | 1 | 1 | 1 | |
| 10 | 19 | 1 | 0 | 1 | 0 | 1 | 1 | 0 | 1 | 0 | 1 | |
| 9 | 20 | 0 | 1 | 1 | 0 | 1 | 1 | 0 | 0 | 1 | 1 | Punctured |
| 8 | 21 | 1 | 1 | 1 | 0 | 1 | 1 | 0 | 1 | 1 | 1 | Punctured |
| 7 | 22 | 0 | 0 | 0 | 1 | 1 | 1 | 0 | 1 | 0 | 0 | |
| 6 | 23 | 1 | 0 | 0 | 1 | 1 | 1 | 1 | 1 | 0 | 1 | |
| 5 | 24 | 0 | 1 | 0 | 1 | 1 | 1 | 1 | 0 | 1 | 0 | Punctured |
| 4 | 25 | 1 | 1 | 0 | 1 | 1 | 1 | 0 | 0 | 0 | 1 | |
| 3 | 26 | 0 | 0 | 1 | 1 | 1 | 1 | 0 | 0 | 1 | 0 | |
| 2 | 27 | 1 | 0 | 1 | 1 | 1 | 1 | 1 | 1 | 0 | 0 | |
| 1 | 28 | 0 | 1 | 1 | 1 | 1 | 1 | 1 | 1 | 1 | 0 | Punctured |
| 0 | 29 | 1 | 1 | 1 | 1 | 1 | 1 | 1 | 1 | 1 | 1 | Punctured |
| 31 | 30 | 0 | 0 | 0 | 0 | 0 | 1 | 0 | 0 | 0 | 0 | Punctured |
| 15 | 31 | 0 | 0 | 0 | 0 | 1 | 1 | 1 | 0 | 0 | 0 | |

As described above, only the row order of Table 6 is different from that of Table 4, but the remaining features of Table 6 are exactly equal to those of Table 4. The representation method of Table 6 has an advantage in that the last 2-bits be punctured during the puncturing time from the (20,10) code to the (18,10) code.

Next, a method for extending the above-mentioned (20,10) code to a maximum of the (20,14) code will hereinafter be described in detail.

As for the (20,A) block code according to this embodiment, it is assumed that a CQI value indicating channel quality information (CQI) of the 3GPP LTE system be applied to the channel coding method for PUCCH transmission. Also, in the case of generating the (20,10) code, the bit number of the CQI information of the 3GPP LTE system can be decided in the range from 4 bits to 10 bits, such that it can be maximally extended to the (20,10) block code. However, in the case of the MIMO system, the bit number of the CQI information In order to search for the added column during the exhaustive search, a large number of calculations must be carried out. Therefore, the execution of the exhaustive search in all the cases may be ineffective or undesirable.

In this step, it should be noted that the sixth column of Table 6 is set to "1" and is used as a basis sequence. Therefore, if the added column must satisfy the minimum distance "d", a minimum number of "0" must be equal to or higher than "d". In this example, the number of "0" is equal to a minimum distance between codewords. In more detail, a difference between the added column and the old sixth column composed of "1" is indicative of a distance between two codewords, such that the number of "0" contained in the added column is equal to the distance between codewords.

Generally, a maximum of a minimum distance available for the (20,10) code is 6. In the present invention, a minimum of a maximum distance available for the (20,11) code corresponding to an extended version of the (20,10) code is 4. In more detail, the maximum-/minimum-distance characteristics based on various information bit numbers of the 20-bit codeword can be represented by Table 7.

TABLE 7

| | k | | | | | | | | | | |
|---|---|---|---|---|---|---|---|---|---|---|---|
| n | 4 | 5 | 6 | 7 | 8 | 9 | 10 | 11 | 12 | 13 | 14 |
| 20 | 8 | 8 | 8 | 6 | 6 | 6 | 6 | 4 | 4 | 4 | 4 |

Therefore, this embodiment of the present invention provides a column adding method, which allows the maximum-/minimum-distance of the added column to be "4". According to this column adding method, a column having at least four "0" values is added to the added column.

In order to minimize the number of searching times, it is assumed that the added column of this embodiment includes 4 number of "0" values (i.e., four "0" values). In this way, if the added column includes the four "0" values and 16 number of "1" values, this added column can be configured in various ways. A representative example of the added column is shown in the following Table 8. If the (20,10) code of Table 6 is extended to the (20,14) code, Table 8 can be acquired.

TABLE 8

| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ | $M_{i,12}$ | $M_{i,13}$ |
|---|---|---|---|---|---|---|---|---|---|---|---|---|---|---|
| 0 | 1 | 0 | 0 | 0 | 0 | 1 | 0 | 0 | 0 | 0 | 1 | 1 | 0 | 1 |
| 2 | 1 | 1 | 0 | 0 | 0 | 1 | 0 | 0 | 0 | 1 | 1 | 1 | 0 | 1 |
| 3 | 0 | 0 | 1 | 0 | 0 | 1 | 1 | 0 | 1 | 1 | 1 | 1 | 1 | 1 |
| 5 | 0 | 1 | 1 | 0 | 0 | 1 | 0 | 0 | 1 | 0 | 1 | 1 | 1 | 1 |
| 6 | 1 | 1 | 1 | 0 | 0 | 1 | 0 | 1 | 0 | 0 | 1 | 1 | 1 | 1 |
| 8 | 1 | 0 | 0 | 1 | 0 | 1 | 1 | 1 | 1 | 0 | 1 | 1 | 1 | 0 |
| 9 | 0 | 1 | 0 | 1 | 0 | 1 | 1 | 0 | 1 | 1 | 1 | 1 | 1 | 0 |
| 11 | 0 | 0 | 1 | 1 | 0 | 1 | 0 | 1 | 1 | 0 | 1 | 1 | 1 | 1 |
| 12 | 1 | 0 | 1 | 1 | 0 | 1 | 0 | 1 | 0 | 1 | 1 | 1 | 1 | 1 |
| 13 | 0 | 1 | 1 | 1 | 0 | 1 | 1 | 0 | 0 | 1 | 1 | 1 | 1 | 1 |
| 16 | 0 | 1 | 0 | 0 | 1 | 1 | 1 | 1 | 0 | 1 | 1 | 1 | 1 | 1 |
| 17 | 1 | 1 | 0 | 0 | 1 | 1 | 1 | 0 | 1 | 0 | 1 | 1 | 1 | 1 |
| 18 | 0 | 0 | 1 | 0 | 1 | 1 | 0 | 1 | 1 | 1 | 1 | 1 | 1 | 1 |
| 19 | 1 | 0 | 1 | 0 | 1 | 1 | 0 | 1 | 0 | 1 | 1 | 1 | 1 | 1 |
| 22 | 0 | 0 | 0 | 1 | 1 | 1 | 0 | 1 | 0 | 0 | 1 | 0 | 1 | 1 |
| 23 | 1 | 0 | 0 | 1 | 1 | 1 | 1 | 1 | 0 | 1 | 1 | 0 | 1 | 1 |
| 25 | 1 | 1 | 0 | 1 | 1 | 1 | 0 | 0 | 1 | 0 | 0 | 1 | 1 | 1 |
| 26 | 0 | 0 | 1 | 1 | 1 | 1 | 0 | 0 | 1 | 0 | 0 | 1 | 1 | 1 |
| 27 | 1 | 0 | 1 | 1 | 1 | 1 | 1 | 1 | 0 | 0 | 0 | 0 | 0 | 1 |
| 31 | 0 | 0 | 0 | 0 | 1 | 1 | 1 | 0 | 0 | 0 | 0 | 0 | 0 | 1 |

With reference to Table 8, the four added columns are indicative of four columns located at the right side. In each added column, "0" is denoted by a bold line.

Based on the above-mentioned facts, a method for modifying or optimizing Table 8 will hereinafter be described in detail.

According to this embodiment, the sixth column of Table 8, i.e., $M_{i,5}$, is considered to be a basis sequence of which all bits is set to "1". This basis sequence greatly contributes to all codewords of a corresponding bit. Therefore, from the viewpoint of the corresponding bit, the use of the basis sequence having many weights may be desirable.

However, several bits in all codewords are exclusive-OR (XOR) operated, such that their combination result must be considered. Thus, in order to reduce the number of the combination cases, the basis sequence in which each of all bits has the value of "1" moves to the frontmost column, resulting in the increase of a contribution rate. In this way, if data is coded under a small number of bits (i.e., a small bit number), the present invention may consider the above method for moving the basis sequence in which each of all bits is "1" to the frontmost column, and the moved result is represented by the following Table 9.

TABLE 9

| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ | $M_{i,12}$ | $M_{i,13}$ |
|---|---|---|---|---|---|---|---|---|---|---|---|---|---|---|
| 0 | 1 | 1 | 0 | 0 | 0 | 0 | 0 | 0 | 0 | 0 | 1 | 1 | 0 | 0 |
| 1 | 1 | 1 | 1 | 1 | 0 | 0 | 0 | 0 | 0 | 0 | 1 | 1 | 1 | 0 | 0 |

TABLE 9-continued

| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ | $M_{i,12}$ | $M_{i,13}$ |
|---|---|---|---|---|---|---|---|---|---|---|---|---|---|---|
| 2 | 1 | 0 | 0 | 1 | 0 | 0 | 1 | 0 | 1 | 1 | 1 | 1 | 1 | 1 |
| 3 | 1 | 0 | 1 | 1 | 0 | 0 | 0 | 0 | 1 | 0 | 1 | 1 | 1 | 1 |
| 4 | 1 | 1 | 1 | 1 | 0 | 0 | 0 | 1 | 0 | 0 | 1 | 1 | 1 | 1 |
| 5 | 1 | 1 | 0 | 0 | 1 | 0 | 1 | 1 | 1 | 0 | 1 | 1 | 1 | 0 |
| 6 | 1 | 0 | 1 | 0 | 1 | 0 | 1 | 0 | 1 | 1 | 1 | 1 | 1 | 0 |
| 7 | 1 | 0 | 0 | 1 | 1 | 0 | 0 | 1 | 1 | 0 | 1 | 1 | 1 | 1 |
| 8 | 1 | 1 | 0 | 1 | 1 | 0 | 0 | 1 | 0 | 1 | 1 | 1 | 1 | 1 |
| 9 | 1 | 0 | 1 | 1 | 1 | 0 | 1 | 0 | 0 | 1 | 1 | 1 | 1 | 1 |
| 10 | 1 | 0 | 1 | 0 | 0 | 1 | 1 | 1 | 0 | 1 | 1 | 1 | 1 | 1 |
| 11 | 1 | 1 | 1 | 0 | 0 | 1 | 1 | 0 | 1 | 0 | 1 | 1 | 1 | 1 |
| 12 | 1 | 0 | 0 | 1 | 0 | 1 | 0 | 1 | 1 | 1 | 1 | 1 | 1 | 1 |
| 13 | 1 | 1 | 0 | 1 | 0 | 1 | 0 | 1 | 0 | 1 | 1 | 1 | 1 | 1 |
| 14 | 1 | 0 | 0 | 0 | 1 | 1 | 0 | 1 | 0 | 0 | 1 | 0 | 1 | 1 |
| 15 | 1 | 1 | 0 | 0 | 1 | 1 | 1 | 1 | 0 | 1 | 1 | 0 | 1 | 1 |
| 16 | 1 | 1 | 1 | 0 | 1 | 1 | 1 | 0 | 0 | 1 | 0 | 1 | 1 | 1 |
| 17 | 1 | 0 | 0 | 1 | 1 | 1 | 0 | 0 | 1 | 0 | 0 | 1 | 1 | 1 |
| 18 | 1 | 1 | 0 | 1 | 1 | 1 | 1 | 0 | 0 | 0 | 0 | 0 | 0 | 1 |
| 19 | 1 | 0 | 0 | 0 | 0 | 1 | 1 | 0 | 0 | 0 | 0 | 0 | 0 | 1 |

With reference to Table 9, a sixth sequence (i.e., each bit of the sixth sequence has the value of "1") from among the original column-directional basis sequence moves to the location of a first basis sequence, and the order of other sequences is not changed to another order.

In the following description, it is assumed that the (20,14) block code structure for PUCCH transmission uses the block code of Table 9. If the number of information bits for PUCCH transmission is limited to a maximum of 13 bits or less, the basis sequence located at the rightmost part of Table 9 may be omitted as necessary, and the omitted result can be represented by the following Table 10.

In order to generate the (32,14) block code, the present invention considers the (20,14) block code (See Table 9) acquired from the (32,10) TFCI block code of the 3GPP Release 99, and at the same time considers the above-mentioned (32,10) TFCI block code. In order to generate the (32,14) block code using the (20,14) block code and the (32,10) TFCI block code, a "TBD" (To be defined) part of FIG. 1 needs to be additionally defined.

FIG. 1 is a conceptual diagram illustrating a method for generating the (32,14) block code using the (32,10) block

TABLE 10

| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ | $M_{i,12}$ |
|---|---|---|---|---|---|---|---|---|---|---|---|---|---|
| 0 | 1 | 1 | 0 | 0 | 0 | 0 | 0 | 0 | 0 | 0 | 1 | 1 | 0 |
| 1 | 1 | 1 | 1 | 0 | 0 | 0 | 0 | 0 | 0 | 1 | 1 | 1 | 0 |
| 2 | 1 | 0 | 0 | 1 | 0 | 0 | 1 | 0 | 1 | 1 | 1 | 1 | 1 |
| 3 | 1 | 0 | 1 | 1 | 0 | 0 | 0 | 0 | 1 | 0 | 1 | 1 | 1 |
| 4 | 1 | 1 | 1 | 1 | 0 | 0 | 0 | 1 | 0 | 0 | 1 | 1 | 1 |
| 5 | 1 | 1 | 0 | 0 | 1 | 0 | 1 | 1 | 1 | 0 | 1 | 1 | 1 |
| 6 | 1 | 0 | 1 | 0 | 1 | 0 | 1 | 0 | 1 | 1 | 1 | 1 | 1 |
| 7 | 1 | 0 | 0 | 1 | 1 | 0 | 0 | 1 | 1 | 0 | 1 | 1 | 1 |
| 8 | 1 | 1 | 0 | 1 | 1 | 0 | 0 | 1 | 0 | 1 | 1 | 1 | 1 |
| 9 | 1 | 0 | 1 | 1 | 1 | 0 | 1 | 0 | 0 | 1 | 1 | 1 | 1 |
| 10 | 1 | 0 | 1 | 0 | 0 | 1 | 1 | 1 | 0 | 1 | 1 | 1 | 1 |
| 11 | 1 | 1 | 1 | 0 | 0 | 1 | 1 | 0 | 1 | 0 | 1 | 1 | 1 |
| 12 | 1 | 0 | 0 | 1 | 0 | 1 | 0 | 1 | 1 | 1 | 1 | 1 | 1 |
| 13 | 1 | 1 | 0 | 1 | 0 | 1 | 0 | 1 | 0 | 1 | 1 | 1 | 1 |
| 14 | 1 | 0 | 0 | 0 | 1 | 1 | 0 | 1 | 0 | 0 | 1 | 0 | 1 |
| 15 | 1 | 1 | 0 | 0 | 1 | 1 | 1 | 1 | 0 | 1 | 1 | 0 | 1 |
| 16 | 1 | 1 | 1 | 0 | 1 | 1 | 1 | 0 | 0 | 1 | 0 | 1 | 1 |
| 17 | 1 | 0 | 0 | 1 | 1 | 1 | 0 | 0 | 1 | 0 | 0 | 1 | 1 |
| 18 | 1 | 1 | 0 | 1 | 1 | 1 | 1 | 0 | 0 | 0 | 0 | 0 | 0 |
| 19 | 1 | 0 | 0 | 0 | 0 | 1 | 1 | 0 | 0 | 0 | 0 | 0 | 0 |

Next, based on the above-mentioned description, a method for generating the (n,k) block code (where n≤32 and k≤14) will hereinafter be described in detail.

(n, k) Block Code (N≤32, K≤14)

A block code having a maximum size of (32,14) will hereinafter be described in detail. In other words, according to this embodiment, a maximum size of the coded bit number is 32, and a maximum size of the information bit number is 14. The coding design can be implemented in various ways, but a coding method according to this embodiment must be designed to search for a maximum number of common points with conventional codes.

code used for a conventional TFCI information coding and the (20,14) code used for PUCCH transmission according to the present invention.

Referring to FIG. 1, if the (32,10) block code 101 used for the TFCI information coding and the (20,14) block code 102 are used to generate the (32,14) block code 104, the TBD part 103 must be additionally defined. In one aspect of any one of block codes, the above-mentioned definition can be analyzed in various ways. Namely, the (32,14) block code 104 according to this embodiment is generated when four basis sequences (corresponding to the combination part between the 102a part and the 103 part of FIG. 1) is added to the right side of the conventional (32,10) block code. In another aspect of the above block codes, 12 row-directional sequences (corresponding to the combination part between the 101*a* part and the 103 part of FIG. 1) are added to either the block code of Table 9 or its equivalent (20,14) block code 102, such that the (32,14) block code 104 may also be generated.

In this case, the conventional TFCI information code shown in Table 1 and its equivalent code can also be used as the (32,10) block code 101. The block code of Table 9 and its equivalent code can also be used as the (20,14) block code 102. In this case, if the order of rows of the conventional block code and/or the order of columns of the conventional block code are/is changed, the above equivalent code is made.

Preferably, if the code is designed, the designed code must allow the TBD 103 to have the best performance at a minimum distance. Generally, according to various information-bit lengths and various coded-bit lengths, the following minimum-distance performances are acquired as shown in Table 11.

TABLE 11

| N | \multicolumn{14}{c}{k} |
|---|---|---|---|---|---|---|---|---|---|---|---|---|---|---|
|   | 1 | 2 | 3 | 4 | 5 | 6 | 7 | 8 | 9 | 10 | 11 | 12 | 13 | 14 |
| 20 | 20 | 10 | 8 | 8 | 8 | 8 | 6 | 6 | 6 | 6 | 4 | 4 | 4 | 4 |
| 32 | 32 | 16 | 16 | 16 | 16 | 16 | 12 | 12 | 12 | 12 | 10 | 10 | 8 | 8 |

With reference to Table 11, in the case of the (32,A) block coding, if "A" is higher than "10", a maximum value of a minimum Hamming distance of the basis sequence is limited to "10".

Therefore, according to a preferred embodiment of the present invention, the TBD part 103 of FIG. 1 along with the 102*a* part of the (20,14) block code 102 must allow a maximum value of the minimum Hamming distance of each basis sequence (corresponding to the combination part between the 102*a* part and the 103 part of FIG. 1) to be "10". In this case, the 102*a* part corresponds to the information bits of more than 10 bits. In more detail, if the number of additional basis sequences is 1 or 2 (i.e., if "A" is 11 or 12), this means that one or two basis sequences are added to allow a minimum Hamming distance of each basis sequence to be "10". If the number of additional basis sequences is 3 or 4 (i.e., if "A" is 13 or 14), this means that three or four basis sequences are added to allow a minimum Hamming distance of each basis sequence to be "8". The (32,10) block code for TFCI information coding includes a basis sequence in which each of all components is "1", such that each of the additional basis sequences may include 10 number of "0" values. In other words, if the (20,14) block code is used as the block code of Table 9, individual basis sequences corresponding to the 102*a* part of FIG. 1 include 4 number of "0" values, such that the basis sequence part corresponding to the TBD part may include 6 number of "0" values.

An example for satisfying the above-mentioned condition is shown in the following Table 12.

TABLE 12

| i | TFCI | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ | $M_{i,12}$ | $M_{i,13}$ |
|---|---|---|---|---|---|---|---|---|---|---|---|---|---|---|---|
| 0 | 0 | 1 | 1 | 0 | 0 | 0 | 0 | 0 | 0 | 0 | 0 | 1 | 1 | 0 | 0 |
| 1 | 2 | 1 | 1 | 1 | 0 | 0 | 0 | 0 | 0 | 0 | 1 | 1 | 1 | 0 | 0 |
| 2 | 3 | 1 | 0 | 0 | 1 | 0 | 0 | 1 | 0 | 1 | 1 | 1 | 1 | 1 | 1 |
| 3 | 5 | 1 | 0 | 1 | 1 | 0 | 0 | 0 | 0 | 1 | 0 | 1 | 1 | 1 | 1 |
| 4 | 6 | 1 | 1 | 1 | 1 | 0 | 0 | 0 | 1 | 0 | 0 | 1 | 1 | 1 | 1 |
| 5 | 8 | 1 | 1 | 0 | 0 | 1 | 0 | 1 | 1 | 1 | 0 | 1 | 1 | 1 | 0 |
| 6 | 9 | 1 | 0 | 1 | 0 | 1 | 0 | 1 | 0 | 1 | 1 | 1 | 1 | 1 | 0 |
| 7 | 11 | 1 | 0 | 0 | 1 | 1 | 0 | 0 | 1 | 1 | 0 | 1 | 1 | 1 | 1 |
| 8 | 12 | 1 | 1 | 0 | 1 | 1 | 0 | 0 | 1 | 0 | 1 | 1 | 1 | 1 | 1 |
| 9 | 13 | 1 | 0 | 1 | 1 | 1 | 0 | 1 | 0 | 0 | 1 | 1 | 1 | 1 | 1 |
| 10 | 16 | 1 | 0 | 1 | 0 | 0 | 1 | 1 | 1 | 0 | 1 | 1 | 1 | 1 | 1 |
| 11 | 17 | 1 | 1 | 1 | 0 | 0 | 1 | 1 | 0 | 1 | 0 | 1 | 1 | 1 | 1 |
| 12 | 18 | 1 | 0 | 0 | 1 | 0 | 1 | 0 | 1 | 1 | 1 | 1 | 1 | 1 | 1 |
| 13 | 19 | 1 | 1 | 0 | 1 | 0 | 1 | 0 | 1 | 0 | 1 | 1 | 1 | 1 | 1 |
| 14 | 22 | 1 | 0 | 0 | 0 | 1 | 1 | 0 | 1 | 0 | 0 | 1 | 0 | 1 | 1 |
| 15 | 23 | 1 | 1 | 0 | 0 | 1 | 1 | 1 | 1 | 0 | 1 | 1 | 0 | 1 | 1 |
| 16 | 25 | 1 | 1 | 1 | 0 | 1 | 1 | 1 | 0 | 0 | 1 | 0 | 1 | 1 | 1 |
| 17 | 26 | 1 | 0 | 0 | 1 | 1 | 1 | 0 | 0 | 1 | 0 | 0 | 1 | 1 | 1 |
| 18 | 27 | 1 | 1 | 0 | 1 | 1 | 1 | 1 | 1 | 0 | 0 | 0 | 0 | 0 | 1 |
| 19 | 31 | 1 | 0 | 0 | 0 | 0 | 1 | 1 | 0 | 0 | 0 | 0 | 0 | 0 | 1 |
| 20 | 1 | 1 | 0 | 1 | 0 | 0 | 0 | 1 | 0 | 0 | 0 | 1 | 0 | 1 | 1 |
| 21 | 4 | 1 | 1 | 0 | 1 | 0 | 0 | 0 | 0 | 0 | 1 | 1 | 1 | 0 | 0 |
| 22 | 7 | 1 | 0 | 0 | 0 | 1 | 0 | 0 | 1 | 1 | 0 | 1 | 0 | 1 | 1 |
| 23 | 10 | 1 | 1 | 1 | 0 | 1 | 0 | 0 | 0 | 1 | 1 | 1 | 1 | 0 | 1 |
| 24 | 14 | 1 | 1 | 1 | 1 | 1 | 0 | 1 | 1 | 1 | 0 | 0 | 0 | 1 | 0 |
| 25 | 15 | 1 | 1 | 0 | 0 | 0 | 1 | 1 | 1 | 0 | 0 | 1 | 1 | 1 | 0 |
| 26 | 20 | 1 | 0 | 1 | 0 | 1 | 0 | 0 | 1 | 1 | 0 | 0 | 0 | 0 | 1 |
| 27 | 21 | 1 | 1 | 1 | 1 | 0 | 1 | 0 | 1 | 1 | 0 | 1 | 0 | 0 | 0 |
| 28 | 24 | 1 | 0 | 1 | 0 | 1 | 1 | 0 | 1 | 0 | 0 | 0 | 1 | 0 | 1 |
| 29 | 28 | 1 | 0 | 1 | 1 | 1 | 1 | 1 | 1 | 0 | 0 | 1 | 1 | 1 | 0 |
| 30 | 29 | 1 | 1 | 1 | 1 | 1 | 1 | 1 | 1 | 1 | 1 | 1 | 0 | 1 | 0 |
| 31 | 30 | 1 | 0 | 0 | 0 | 0 | 0 | 0 | 0 | 0 | 0 | 0 | 0 | 0 | 1 |

As can be seen from Table 12, if 12 rows from the bottom of Table 12 are deleted, the (20,14) code for PUCCH transmission is formed. If 14 rows from the bottom of Table 12 are deleted, the (18,14) code is formed. Various application of the information bit can be easily implemented, and as many basis sequences of Table 12 as the number of corresponding information bits are acquired from Table 12, such that the acquired basis sequences are used for the coding process. If a maximum number of information bits (i.e., a maximum information-bit number) of FIG. 12 is less than 14 (i.e., 14 bits), basis sequences as many as the predetermined number unnecessary for the basis-sequence table such as Table 9 may be deleted from the right column. This means that basis sequences as many as the number of information bits required for the (32,10) block code may be added.

For example, provided that a maximum information-bit number is limited to 11 bits, the following (32,11) block code of Table 13 can be used.

TABLE 13

| i | TFCI | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ |
|---|---|---|---|---|---|---|---|---|---|---|---|---|
| 0 | 0 | 1 | 1 | 0 | 0 | 0 | 0 | 0 | 0 | 0 | 0 | 1 |
| 1 | 2 | 1 | 1 | 1 | 0 | 0 | 0 | 0 | 0 | 0 | 1 | 1 |
| 2 | 3 | 1 | 0 | 0 | 1 | 0 | 0 | 1 | 0 | 1 | 1 | 1 |
| 3 | 5 | 1 | 0 | 1 | 1 | 0 | 0 | 0 | 1 | 0 | 0 | 1 |
| 4 | 6 | 1 | 1 | 1 | 1 | 0 | 0 | 0 | 1 | 0 | 0 | 1 |
| 5 | 8 | 1 | 1 | 0 | 0 | 1 | 0 | 1 | 1 | 1 | 0 | 1 |
| 6 | 9 | 1 | 0 | 1 | 0 | 1 | 0 | 1 | 0 | 1 | 1 | 1 |
| 7 | 11 | 1 | 0 | 0 | 1 | 1 | 0 | 0 | 1 | 1 | 0 | 1 |
| 8 | 12 | 1 | 1 | 0 | 1 | 1 | 0 | 0 | 1 | 0 | 1 | 1 |
| 9 | 13 | 1 | 0 | 1 | 1 | 1 | 0 | 1 | 0 | 0 | 1 | 1 |
| 10 | 16 | 1 | 0 | 1 | 0 | 0 | 1 | 1 | 1 | 0 | 1 | 1 |
| 11 | 17 | 1 | 1 | 1 | 0 | 0 | 1 | 1 | 0 | 1 | 0 | 1 |
| 12 | 18 | 1 | 0 | 0 | 1 | 0 | 1 | 0 | 1 | 1 | 1 | 1 |
| 13 | 19 | 1 | 1 | 0 | 1 | 0 | 1 | 0 | 1 | 0 | 1 | 1 |
| 14 | 22 | 1 | 0 | 0 | 0 | 1 | 1 | 0 | 1 | 0 | 0 | 1 |
| 15 | 23 | 1 | 1 | 0 | 0 | 1 | 1 | 1 | 1 | 0 | 1 | 1 |
| 16 | 25 | 1 | 1 | 1 | 0 | 1 | 1 | 1 | 0 | 0 | 1 | 0 |
| 17 | 26 | 1 | 0 | 0 | 1 | 1 | 1 | 0 | 0 | 1 | 0 | 0 |
| 18 | 27 | 1 | 1 | 0 | 1 | 1 | 1 | 1 | 1 | 0 | 0 | 0 |
| 19 | 31 | 1 | 0 | 0 | 0 | 0 | 1 | 1 | 0 | 0 | 0 | 0 |
| 20 | 1 | 1 | 0 | 1 | 0 | 0 | 0 | 1 | 0 | 0 | 0 | 1 |
| 21 | 4 | 1 | 1 | 0 | 1 | 0 | 0 | 0 | 0 | 0 | 1 | 1 |
| 22 | 7 | 1 | 0 | 0 | 0 | 1 | 0 | 0 | 1 | 1 | 0 | 1 |
| 23 | 10 | 1 | 1 | 1 | 0 | 1 | 0 | 0 | 0 | 1 | 1 | 1 |
| 24 | 14 | 1 | 1 | 1 | 1 | 1 | 0 | 1 | 1 | 1 | 1 | 0 |
| 25 | 15 | 1 | 1 | 0 | 0 | 0 | 1 | 1 | 1 | 0 | 0 | 1 |
| 26 | 20 | 1 | 0 | 1 | 1 | 0 | 1 | 0 | 0 | 1 | 1 | 0 |
| 27 | 21 | 1 | 1 | 1 | 1 | 0 | 1 | 0 | 1 | 1 | 1 | 0 |
| 28 | 24 | 1 | 0 | 1 | 0 | 1 | 1 | 1 | 0 | 1 | 0 | 0 |
| 29 | 28 | 1 | 0 | 1 | 1 | 1 | 1 | 1 | 1 | 1 | 0 | 0 |
| 30 | 29 | 1 | 1 | 1 | 1 | 1 | 1 | 1 | 1 | 1 | 1 | 1 |
| 31 | 30 | 1 | 0 | 0 | 0 | 0 | 0 | 0 | 0 | 0 | 0 | 0 |

In the meantime, a method for arranging the (32,k) block code in consideration of the (16,k) block code will hereinafter be described in detail.

A method for generating an optimum code of the (32,k) block code of Table 12 or Table 13 is as follows. In the case of generating the (20,k) or (18,k) block code, if the remaining rows from the lowest row are deleted, the above optimum code of the (32,k) block code can be generated. However, if the (16,k) block code is needed, much consideration is needed. Therefore, according to this embodiment of the present invention, the row order of the above (32,k) block code is changed in consideration of the (16,k) block code. If the (16,k) block code is needed, although some rows from the lowest row of the (32,k) block code are deleted and used, the present invention is able to generate a necessary code. A representative example is shown in the following Table 14.

TABLE 14

| i | TFCI | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ | $M_{i,12}$ | $M_{i,13}$ |
|---|---|---|---|---|---|---|---|---|---|---|---|---|---|---|---|
| 0 | 0 | 1 | 1 | 0 | 0 | 0 | 0 | 0 | 0 | 0 | 0 | 1 | 1 | 0 | 0 |
| 1 | 2 | 1 | 1 | 1 | 0 | 0 | 0 | 0 | 0 | 0 | 0 | 1 | 1 | 0 | 0 |
| 2 | 3 | 1 | 0 | 0 | 1 | 0 | 0 | 1 | 0 | 1 | 1 | 1 | 1 | 1 | 1 |
| 3 | 5 | 1 | 0 | 1 | 1 | 0 | 0 | 0 | 1 | 0 | 1 | 1 | 1 | 1 | 1 |
| 4 | 6 | 1 | 1 | 1 | 1 | 0 | 0 | 0 | 1 | 0 | 0 | 1 | 1 | 1 | 1 |
| 6 | 9 | 1 | 0 | 1 | 0 | 1 | 0 | 1 | 0 | 1 | 1 | 1 | 1 | 1 | 0 |

TABLE 14-continued

| i | TFCI | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ | $M_{i,12}$ | $M_{i,13}$ |
|---|---|---|---|---|---|---|---|---|---|---|---|---|---|---|---|
| 8 | 12 | 1 | 1 | 0 | 1 | 1 | 0 | 0 | 1 | 0 | 1 | 1 | 1 | 1 | 1 |
| 9 | 13 | 1 | 0 | 1 | 1 | 1 | 0 | 1 | 0 | 0 | 1 | 1 | 1 | 1 | 1 |
| 10 | 16 | 1 | 0 | 1 | 0 | 0 | 1 | 1 | 1 | 0 | 1 | 1 | 1 | 1 | 1 |
| 11 | 17 | 1 | 1 | 1 | 0 | 0 | 1 | 1 | 0 | 1 | 0 | 1 | 1 | 1 | 1 |
| 12 | 18 | 1 | 0 | 0 | 1 | 0 | 1 | 0 | 1 | 1 | 1 | 1 | 1 | 1 | 1 |
| 13 | 19 | 1 | 1 | 0 | 1 | 0 | 1 | 0 | 1 | 0 | 1 | 1 | 1 | 1 | 1 |
| 15 | 23 | 1 | 1 | 0 | 0 | 1 | 1 | 1 | 1 | 0 | 1 | 1 | 0 | 1 | 1 |
| 16 | 25 | 1 | 1 | 1 | 0 | 1 | 1 | 1 | 0 | 0 | 1 | 0 | 1 | 1 | 1 |
| 17 | 26 | 1 | 0 | 0 | 1 | 1 | 1 | 0 | 0 | 1 | 0 | 0 | 1 | 1 | 1 |
| 19 | 31 | 1 | 0 | 0 | 0 | 0 | 1 | 1 | 0 | 0 | 0 | 0 | 0 | 0 | 1 |
| 7 | 11 | 1 | 0 | 0 | 1 | 1 | 0 | 0 | 1 | 1 | 0 | 1 | 1 | 1 | 1 |
| 14 | 22 | 1 | 0 | 0 | 0 | 1 | 1 | 0 | 1 | 0 | 0 | 1 | 0 | 1 | 1 |
| 5 | 8 | 1 | 1 | 0 | 0 | 1 | 0 | 1 | 1 | 1 | 0 | 1 | 1 | 1 | 0 |
| 18 | 27 | 1 | 1 | 0 | 1 | 1 | 1 | 1 | 1 | 0 | 0 | 0 | 0 | 0 | 1 |
| 20 | 1 | 1 | 0 | 1 | 0 | 0 | 0 | 1 | 0 | 0 | 0 | 1 | 0 | 1 | 1 |
| 21 | 4 | 1 | 1 | 0 | 1 | 0 | 0 | 0 | 0 | 0 | 1 | 1 | 1 | 0 | 0 |
| 22 | 7 | 1 | 0 | 0 | 0 | 1 | 0 | 0 | 1 | 1 | 0 | 1 | 0 | 1 | 1 |
| 23 | 10 | 1 | 1 | 1 | 0 | 1 | 0 | 0 | 0 | 1 | 1 | 1 | 1 | 0 | 1 |
| 24 | 14 | 1 | 1 | 1 | 1 | 0 | 1 | 1 | 1 | 1 | 0 | 0 | 1 | 1 | 0 |
| 25 | 15 | 1 | 1 | 0 | 0 | 0 | 1 | 1 | 1 | 0 | 0 | 1 | 1 | 1 | 0 |
| 26 | 20 | 1 | 0 | 1 | 1 | 0 | 1 | 0 | 0 | 1 | 1 | 0 | 0 | 0 | 1 |
| 27 | 21 | 1 | 1 | 1 | 1 | 0 | 1 | 0 | 1 | 1 | 1 | 0 | 1 | 0 | 0 |
| 28 | 24 | 1 | 0 | 1 | 0 | 0 | 1 | 1 | 0 | 1 | 0 | 0 | 1 | 0 | 1 |
| 29 | 28 | 1 | 0 | 1 | 1 | 1 | 1 | 1 | 1 | 1 | 0 | 0 | 1 | 1 | 0 |
| 30 | 29 | 1 | 1 | 1 | 1 | 1 | 1 | 1 | 1 | 1 | 1 | 1 | 0 | 1 | 0 |
| 31 | 30 | 1 | 0 | 0 | 0 | 0 | 0 | 0 | 0 | 0 | 0 | 0 | 0 | 0 | 1 |

In Table 14, during the code conversion from the (32,k) code to the (20,k) code, if 12 rows are deleted from Table 14 on the basis of the lowest row, an optimum code is generated. If 14 rows are deleted from Table 14 on the basis of the lowest row, the (18,k) code is generated. If 16 rows are deleted from Table 14 on the basis of the lowest row, the (16,k) code is generated.

In the meantime, based on the above-mentioned description, if a codeword of more than 32 bits is needed, the following channel coding method can be carried out.

If Codeword of More than 32 Bits is Needed:

If the codeword of more than 32 bits is needed, the present invention provides a method for generating the long-length (n,k) code by repeating the above basis sequence on the basis of the (32,k) or (20,k) code used as a base code.

The (32,k) or (20,k) code can be easily generated on the basis of Table 12 or Table 14. In the meantime, in order to assign a stronger or higher error correction capability to a transmission (Tx) bit, the present invention may increase the number of coded bits (i.e., the coded bit number). In this case, it is preferable that a new code corresponding to the increased number of coded bits be generated, but it is very difficult for a code designer to design a new code whenever the number of coded bits increases. Therefore, one of simple generation methods is to repeat the base code by a desired length. If the desired length is not accurately represented by an integer multiple of the base code, the base code is repeated by at least the desired length, and as many base codes as the number of excessive bits may be removed. In this case, although the present invention is able to search for an optimum puncturing pattern every time, the present invention can substantially consider a simple puncturing method based on a rate matching block.

In this case, the present invention may consider the (32,k) or (20,k) code as the base code. For the convenience of description, the present invention considers only a specific case in which a desired length has the size of an integer multiple of the base code. In the remaining cases, it is assumed that the present invention is able to acquire a necessary code using the puncturing method. Also, the present invention is able to use a variety of "k" values. In this case, for the convenience of description, it is assumed that a maximum size of "k" is set to 14. Although there is no mention of the smaller size of less than 14 in the present invention, it is well known to those skilled in the art that a basis sequence corresponding to a corresponding length be selected and used.

For example, if the (64,14) code is needed, the (32,14) code can be repeated only two times. If the (40,14) code is needed, the (20,14) code can be repeated only two times. Also, the (32,14) code and the (20,14) code are simultaneously considered as the base code, such that the (32,14) code and the (20,14) code are sequentially attached to configure the (52,14) code.

In conclusion, the combination of available codes may be determined to be the (a*32+b*20,14) code (where "a" or "b" is an integer number of at least "0".

If the desired length of coded bits is not denoted by an integer multiple of the base code, the base code is repeated to be longer than the desired length, unnecessary parts may be severed from the end part of the longer-sized code or may be punctured using the rate matching blocks.

In the meantime, according to another aspect of the present invention, after the order of information bits has been reversed, the base code may then be repeated.

As described above, if the base code is continuously repeated, minimum-distance characteristics of the base code are maintained without any change, such that the resultant minimum-distance characteristics are repeated. Therefore, if the code having an original minimum distance of 4 is repeated two times, the minimum distance is increased by two times, such that the minimum distance of the resultant code reaches "8".

However, provided that any variation is applied to the information bit during the above repetition, although the information bit which forms a codeword having a minimum distance is used, a codeword generated by another information bit changed by the above repetition is able to form another codeword having the distance longer than the above-mentioned minimum distance. If the minimum distance is not repeated according to the above-mentioned principles, a code can be designed such that the minimum-distance characteristics can be larger than those of a simple multiple.

The present invention can consider a variety of methods for changing the information bit. For example, in order to change the above-mentioned information bit, a method for using a reverse version of a bit unit, and a method for allowing the information bit to pass through a random sequence such as a PN sequence can be used in the present invention.

Also, the present invention may assign different information-bit variations to individual repetition times, such that the information bit is differently changed whenever the repetition occurs. However, in this case, the complexity of a transmission/reception end increases. If the repetition is performed several times, the present invention may not change the information bit in the first time, and may change the information bit in the next time.

In more detail, in the case of repeating the code according to this embodiment, the information bit is not changed at the even-th repetition, but is changed at the odd-th repetition. In other words, the present invention controls the information-bit variation to be toggled whenever the repetition occurs.

For example, under the condition that the (20,k) code and the (32,k) code are used as the base codes, the (40,k) code, the (52,k) code, and the (64,k) code can be generated according to the present invention. A detailed description thereof will hereinafter be described.

Figure 2:
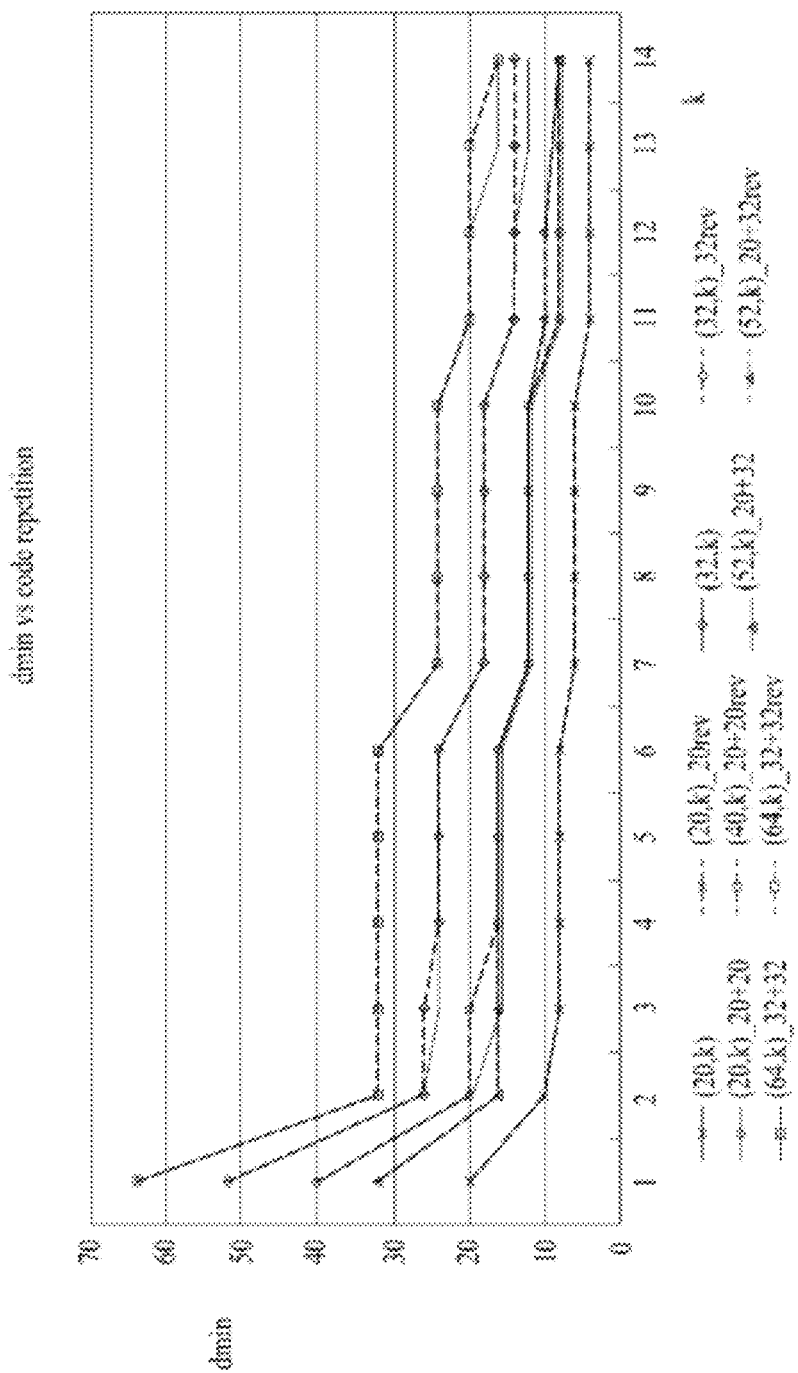
FIG. 2 is a graph illustrating minimum-distance performances acquired when the (40,k) block code, the (52,k) block code, and the (64,k) block code are generated on the condition that the (20,k) block code and the (32,k) block code are used as base codes.

FIG. 2 is a graph illustrating minimum-distance performances acquired when the (40,k) block code, the (52,k) block code, and the (64,k) block code are generated on the condition that the (20,k) block code and the (32,k) block code are used as base codes.

Referring to FIG. 2, "(40,k)_20+20" indicates that the (20,k) code acting as the base code is repeated two times. "(20,k)_20rev" indicates that the information bit is reversed from the (20,k) code acting as the base code. "(32,k)_32rev" can be analyzed in the same method as the above-mentioned method.

"(40,k)_20+20rev" indicates that the (20,k) code used as the base code was repeated two times, an information bit was changed according to the toggle method at the first repetition time, and the information bit was then reversed at the second repetition time. In this way, "(64,k)_32+32rev" can also be analyzed in the same method as the above. In the meantime, "(52,k)_20+32rev" indicates that the (32,k) and (20,k) codes were selected as base codes, each of the selected base codes was repeated only once, and the (32,k) code acting as the second base code was bit-reversed and the information bit was then applied to the bit-reverse result.

In FIG. 2, if the value of k is denoted by k≥4, the "(40,k)_20" code has a low performance less than that of the (32,k) code. Therefore, it can be recognized that the operation of using the (32,k) code with less number of coded bits has a good performance higher than that of the operation of repeating the (20,k) code two times. In other words, the repetition of (32,k) code with less number of coded bits has a high performance superior to that of the repetition of (20,k) code. Therefore, the preferred embodiment of the present invention provides a method for repeatedly using the (32,k) code during the coding process for a long-length coded bit. In other words, according to this embodiment of the present invention, provided that the (32,k) code was selected as the base code, the bit number (i.e., the number of bits) of the last output sequence was equal to or higher than 32 (i.e., 32 bits), and an integer multiple of the base code was not implemented, the (32,k) code is repeated to be longer than a desired length, and unnecessary parts (i.e., corresponding to the bit number of the needed output sequence) are severed from the end of the repeated result.

The above-mentioned embodiment can be analyzed as follows. In more detail, if the length of the needed output sequence is at least 32 bits, it can be recognized that the coded result of the (32,k) block code was cyclically repeated to acquire the above output sequence. Namely, provided that the 32-bit-length codeword, which has been channel-coded by the (32,k) block code, is represented by $b_0, b_1, b_2, b_3, \ldots, b_{B-1}$ (where B=32), and the output sequence longer than the length of 32 bits (e.g., the bit length of "Q") is represented by $q_0, q_1, q_2, q_3, \ldots, q_{Q-1}$, the following relationship between the output sequence and the channel-coded 32-bit-length codeword can be represented by the following Equation 3.

$$q_i = b_{(i \bmod B)} \text{ where } i=0, 1, 2, \ldots, Q-1 \qquad \text{[Equation 3]}$$

As can be seen from Equation 3, the output sequence component having the index "i" corresponds to a codeword component which has an index corresponding to the modulo-operation result value. In this case, the modulo-operation result value is acquired when the index "i" was modulo-operated with the "B" value of 32. If the Q value is higher than 32, the output sequence is acquired when the channel-coded sequence was cyclically repeated. This also means that the (32,k) code was repeated a predetermined number of times and the part corresponding to the length of a necessary codeword was selected and used. As well known to those skilled in the art, the above-mentioned operation results have been substantially equal to each other, but they have been analyzed in different ways.

In the meantime, as can be seen from FIG. 2, the performance of the "(52,k)_20+32rev" code is equal to or higher than that of the "(52,k)_20+32" code, and the performance of the (40,k)_20+20rev" code is equal to or higher than that of "(40,k)_20+20". Therefore, in order to improve the minimum-distance characteristics, the information bit is repeated without any change at the first repetition time, and is then reversed at the next repetition time.

Finally, if the last information bit number is not denoted by an integer multiple of the base code, the base code is repeated to be longer than a desired length, and unnecessary parts can be severed from the end part of the repeated result, or can be punctured by the rate matching block method.

In the meantime, the above-mentioned method for performing the bit reversion of the information bit according to the toggle scheme can also be applied to not only the repetition of the above-mentioned base code but also other repetitions of various base codes. For example, when the repetitive coding of the simplex code of ACK/NACK control information is performed, the information bit is coded without any change at the first repetition time, and the bit-reversion information bit of the ACK/NACK control information is then coded at the second repetition time.

It should be noted that most terminology disclosed in the present invention is defined in consideration of functions of the present invention, and can be differently determined according to intention of those skilled in the art or usual practices. Therefore, it is preferable that the above-mentioned terminology be understood on the basis of all contents disclosed in the present invention. It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

That is, the present invention is not limited to only the embodiments described herein and includes the widest range equivalent to principles and features disclosed herein.

As apparent from the above description, the channel coding method according to the present invention can be easily applied to the other channel coding of the 3GPP LTE system which transmits CQI/PMI information to an uplink via a PUSCH channel. However, the above-mentioned methods are not limited to only the above 3GPP LTE system, but they can also be applied to a variety of communication schemes, each of which performs the block coding on various-length information.

What is claimed is:

1. A method for channel-coding input bits having a length of A, the method comprising:
channel-coding the input bits by using basis sequences $M_{i,0}$ to $M_{i,A-1}$ from a (32, A) block code to generate encoded bits, wherein the (32, A) block code includes basis sequences $M_{i,0}$ to $M_{i,10}$ as defined in the following:

TABLE

| i | $M_{i,0}$ | $M_{i,1}$ | $M_{i,2}$ | $M_{i,3}$ | $M_{i,4}$ | $M_{i,5}$ |
|---|---|---|---|---|---|---|
| 0 | 1 | 1 | 0 | 0 | 0 | 0 |
| 1 | 1 | 1 | 1 | 0 | 0 | 0 |
| 2 | 1 | 0 | 0 | 1 | 0 | 0 |
| 3 | 1 | 0 | 1 | 1 | 0 | 0 |
| 4 | 1 | 1 | 1 | 1 | 0 | 0 |
| 5 | 1 | 1 | 0 | 0 | 1 | 0 |
| 6 | 1 | 0 | 1 | 0 | 1 | 0 |
| 7 | 1 | 0 | 0 | 1 | 1 | 0 |
| 8 | 1 | 1 | 0 | 1 | 1 | 0 |
| 9 | 1 | 0 | 1 | 1 | 1 | 0 |
| 10 | 1 | 0 | 1 | 0 | 0 | 1 |
| 11 | 1 | 1 | 1 | 0 | 0 | 1 |
| 12 | 1 | 0 | 0 | 1 | 0 | 1 |
| 13 | 1 | 1 | 0 | 1 | 0 | 1 |
| 14 | 1 | 0 | 0 | 0 | 1 | 1 |
| 15 | 1 | 1 | 0 | 0 | 1 | 1 |
| 16 | 1 | 1 | 1 | 0 | 1 | 1 |
| 17 | 1 | 0 | 0 | 1 | 1 | 1 |
| 18 | 1 | 1 | 0 | 1 | 1 | 1 |
| 19 | 1 | 0 | 0 | 0 | 0 | 1 |
| 20 | 1 | 0 | 1 | 0 | 0 | 0 |
| 21 | 1 | 1 | 0 | 1 | 0 | 0 |
| 22 | 1 | 0 | 0 | 0 | 1 | 0 |
| 23 | 1 | 1 | 1 | 0 | 1 | 0 |
| 24 | 1 | 1 | 1 | 1 | 1 | 0 |
| 25 | 1 | 1 | 0 | 0 | 0 | 1 |
| 26 | 1 | 0 | 1 | 1 | 0 | 1 |
| 27 | 1 | 1 | 1 | 1 | 0 | 1 |
| 28 | 1 | 0 | 1 | 0 | 1 | 1 |
| 29 | 1 | 0 | 1 | 1 | 1 | 1 |
| 30 | 1 | 1 | 1 | 1 | 1 | 1 |
| 31 | 1 | 0 | 0 | 0 | 0 | 0 |

| i | $M_{i,6}$ | $M_{i,7}$ | $M_{i,8}$ | $M_{i,9}$ | $M_{i,10}$ |
|---|---|---|---|---|---|
| 0 | 0 | 0 | 0 | 0 | 1 |
| 1 | 0 | 0 | 0 | 1 | 1 |
| 2 | 1 | 0 | 1 | 1 | 1 |
| 3 | 0 | 0 | 1 | 0 | 1 |
| 4 | 0 | 1 | 0 | 0 | 1 |
| 5 | 1 | 1 | 1 | 0 | 1 |
| 6 | 1 | 0 | 1 | 1 | 1 |
| 7 | 0 | 1 | 1 | 0 | 1 |
| 8 | 0 | 1 | 0 | 1 | 1 |
| 9 | 1 | 0 | 0 | 1 | 1 |
| 10 | 1 | 1 | 0 | 1 | 1 |
| 11 | 1 | 0 | 1 | 0 | 1 |
| 12 | 0 | 1 | 1 | 1 | 1 |
| 13 | 0 | 1 | 0 | 1 | 1 |
| 14 | 0 | 1 | 0 | 0 | 1 |
| 15 | 1 | 1 | 0 | 1 | 1 |
| 16 | 1 | 0 | 0 | 1 | 0 |
| 17 | 0 | 0 | 1 | 0 | 0 |
| 18 | 1 | 1 | 0 | 0 | 0 |
| 19 | 1 | 0 | 0 | 0 | 0 |
| 20 | 1 | 0 | 0 | 0 | 1 |
| 21 | 0 | 0 | 0 | 1 | 1 |
| 22 | 0 | 1 | 1 | 0 | 1 |
| 23 | 0 | 0 | 1 | 1 | 1 |
| 24 | 1 | 1 | 1 | 1 | 0 |
| 25 | 1 | 1 | 0 | 0 | 1 |
| 26 | 0 | 0 | 1 | 1 | 0 |
| 27 | 0 | 1 | 1 | 1 | 0 |
| 28 | 1 | 0 | 1 | 0 | 0 |
| 29 | 1 | 1 | 1 | 0 | 0 |
| 30 | 1 | 1 | 1 | 1 | 1 |
| 31 | 0 | 0 | 0 | 0 | 0; | wherein A is 11.

2. The method of claim 1, wherein the input bits are sequentially assigned to the basis sequences $M_{i,0}$ to $M_{i,A-1}$.

3. A device for channel-coding input bits having a length of A, wherein the device is configured to:
channel-code the input bits by using basis sequences $M_{i,0}$ to $M_{i,A-1}$ from a (32, A) block code to generate encoded bits, wherein the (32, A) block code includes basis sequences $M_{i,0}$ to $M_{i,10}$ as defined in the following:

TABLE

| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ |
|---|---|---|---|---|---|---|---|---|---|---|---|
| 0 | 1 | 1 | 0 | 0 | 0 | 0 | 0 | 0 | 0 | 0 | 1 |
| 1 | 1 | 1 | 1 | 0 | 0 | 0 | 0 | 0 | 0 | 1 | 1 |
| 2 | 1 | 0 | 0 | 1 | 0 | 0 | 1 | 0 | 1 | 1 | 1 |
| 3 | 1 | 0 | 1 | 1 | 0 | 0 | 0 | 0 | 1 | 0 | 1 |
| 4 | 1 | 1 | 1 | 1 | 0 | 0 | 0 | 1 | 0 | 0 | 1 |
| 5 | 1 | 1 | 0 | 0 | 1 | 0 | 1 | 1 | 1 | 0 | 1 |
| 6 | 1 | 0 | 1 | 0 | 1 | 0 | 1 | 0 | 1 | 1 | 1 |
| 7 | 1 | 0 | 0 | 1 | 1 | 0 | 0 | 1 | 1 | 0 | 1 |
| 8 | 1 | 1 | 0 | 1 | 1 | 0 | 0 | 1 | 0 | 1 | 1 |
| 9 | 1 | 0 | 1 | 1 | 1 | 0 | 1 | 0 | 0 | 1 | 1 |
| 10 | 1 | 0 | 1 | 0 | 0 | 1 | 1 | 1 | 0 | 1 | 1 |
| 11 | 1 | 1 | 1 | 0 | 0 | 1 | 1 | 0 | 1 | 0 | 1 |
| 12 | 1 | 0 | 0 | 1 | 0 | 1 | 0 | 1 | 1 | 1 | 1 |
| 13 | 1 | 1 | 0 | 1 | 0 | 1 | 0 | 1 | 0 | 1 | 1 |
| 14 | 1 | 0 | 0 | 0 | 1 | 1 | 0 | 1 | 0 | 0 | 1 |
| 15 | 1 | 1 | 0 | 0 | 1 | 1 | 1 | 1 | 0 | 1 | 1 |
| 16 | 1 | 1 | 1 | 0 | 1 | 1 | 1 | 0 | 0 | 1 | 0 |
| 17 | 1 | 0 | 0 | 1 | 1 | 1 | 0 | 0 | 1 | 0 | 0 |
| 18 | 1 | 1 | 0 | 1 | 1 | 1 | 1 | 1 | 0 | 0 | 0 |
| 19 | 1 | 0 | 0 | 0 | 0 | 1 | 1 | 0 | 0 | 0 | 0 |
| 20 | 1 | 0 | 1 | 0 | 0 | 0 | 1 | 0 | 0 | 0 | 1 |

TABLE-continued

| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ |
|---|---|---|---|---|---|---|---|---|---|---|---|
| 21 | 1 | 1 | 0 | 1 | 0 | 0 | 0 | 0 | 0 | 1 | 1 |
| 22 | 1 | 0 | 0 | 0 | 1 | 0 | 0 | 1 | 1 | 0 | 1 |
| 23 | 1 | 1 | 1 | 0 | 1 | 0 | 0 | 0 | 1 | 1 | 1 |
| 24 | 1 | 1 | 1 | 1 | 1 | 0 | 1 | 1 | 1 | 1 | 0 |
| 25 | 1 | 1 | 0 | 0 | 0 | 1 | 1 | 1 | 0 | 0 | 1 |
| 26 | 1 | 0 | 1 | 1 | 0 | 1 | 0 | 0 | 1 | 1 | 0 |
| 27 | 1 | 1 | 1 | 1 | 0 | 1 | 0 | 1 | 1 | 1 | 0 |
| 28 | 1 | 0 | 1 | 0 | 1 | 1 | 1 | 0 | 1 | 0 | 0 |
| 29 | 1 | 0 | 1 | 1 | 1 | 1 | 1 | 1 | 1 | 0 | 0 |
| 30 | 1 | 1 | 1 | 1 | 1 | 1 | 1 | 1 | 1 | 1 | 1 |
| 31 | 1 | 0 | 0 | 0 | 0 | 0 | 0 | 0 | 0 | 0 | 0; | wherein A is 11.

4. The device of claim 3, wherein the input bits are sequentially assigned to the basis sequence $M_{i,0}$ to $M_{i,A-1}$.

\* \* \* \* \*